(12) United States Patent
Hayashi et al.

(10) Patent No.: US 11,682,732 B2
(45) Date of Patent: Jun. 20, 2023

(54) SEMICONDUCTOR SUBSTRATE AND DISPLAY DEVICE

(71) Applicant: Japan Display Inc., Tokyo (JP)

(72) Inventors: Hirotaka Hayashi, Tokyo (JP); Masataka Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 149 days.

(21) Appl. No.: 17/184,708

(22) Filed: Feb. 25, 2021

(65) Prior Publication Data

US 2021/0273108 A1    Sep. 2, 2021

(30) Foreign Application Priority Data

Feb. 28, 2020  (JP) .............................. JP2020-033370

(51) Int. Cl.
*H01L 29/786*  (2006.01)
*G02F 1/167*  (2019.01)

(52) U.S. Cl.
CPC .......... *H01L 29/7869* (2013.01); *G02F 1/167* (2013.01)

(58) Field of Classification Search
CPC ............. H01L 27/1225; H01L 27/3262; H01L 27/3279; H01L 27/1255; H01L 27/1288; H01L 29/7869; H01L 29/247; H01L 29/78602; H01L 29/78696; H01L 29/78618; G02F 1/16766; G02F 1/167; G02F 1/1345; G02F 1/13394; G02F 1/1343; G02F 1/133707
See application file for complete search history.

(56) References Cited

U.S. PATENT DOCUMENTS

| | | | |
|---|---|---|---|
| 9,470,950 B2 * | 10/2016 | Paolini, Jr. .............. | B32B 37/16 |
| 10,203,567 B2 * | 2/2019 | Lee ................... | G02F 1/133514 |
| 10,937,997 B2 * | 3/2021 | Tanaka ................ | G09G 3/3258 |
| 2016/0062206 A1 * | 3/2016 | Paolini, Jr. .............. | B32B 37/16 |
| | | | 156/247 |
| 2017/0322462 A1 * | 11/2017 | Lee ................... | G02F 1/133512 |
| 2020/0274108 A1 * | 8/2020 | Tanaka ................ | G09G 3/3233 |

FOREIGN PATENT DOCUMENTS

JP         2011-221097 A        11/2011

* cited by examiner

*Primary Examiner* — Nikolay K Yushin
(74) *Attorney, Agent, or Firm* — Maier & Maier, PLLC

(57) ABSTRACT

According to one embodiment, a semiconductor layer includes a base, a scanning line disposed over the base, a signal line disposed over the base, a transistor overlapping the scanning line and the signal line and including a first oxide semiconductor layer connected to the signal line, and second oxide semiconductor layers disposed in a same layer as the first oxide semiconductor layer. The second oxide semiconductor layers are disposed around the transistor, and the second oxide semiconductor layers are floating.

16 Claims, 15 Drawing Sheets

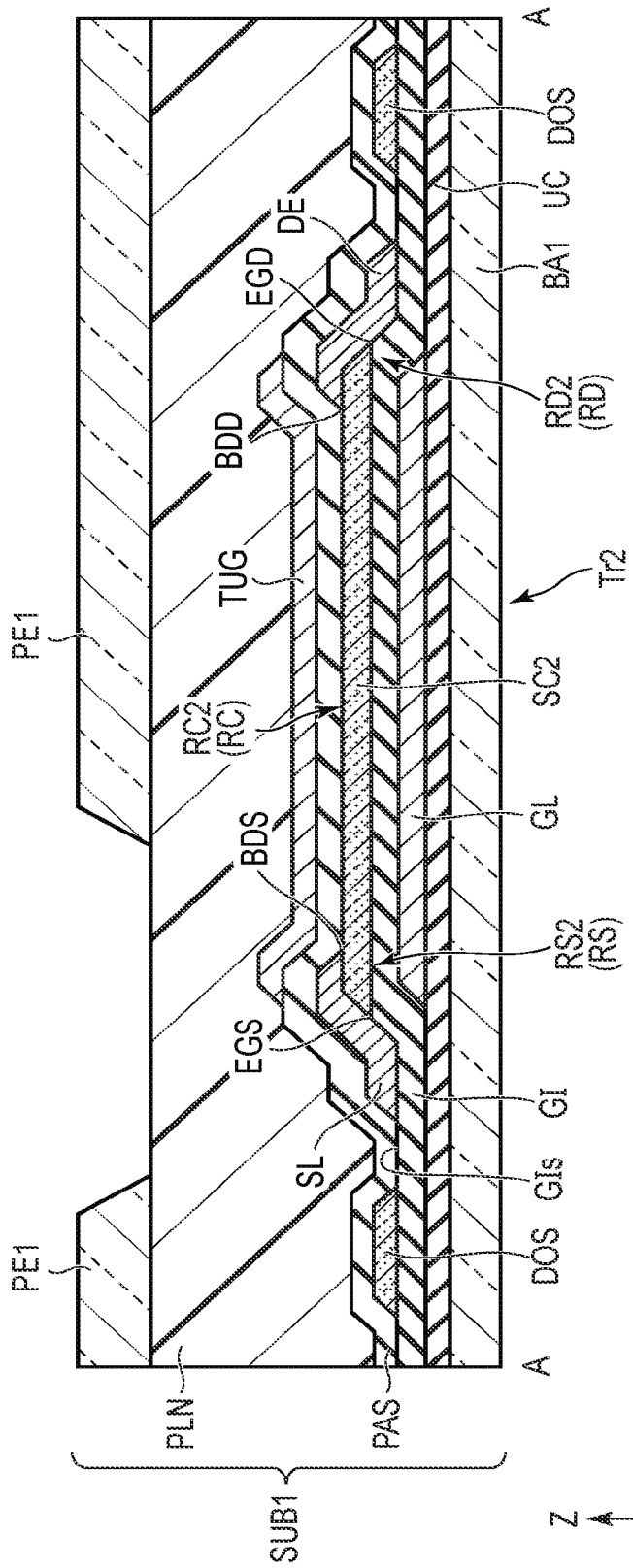
F I G. 2

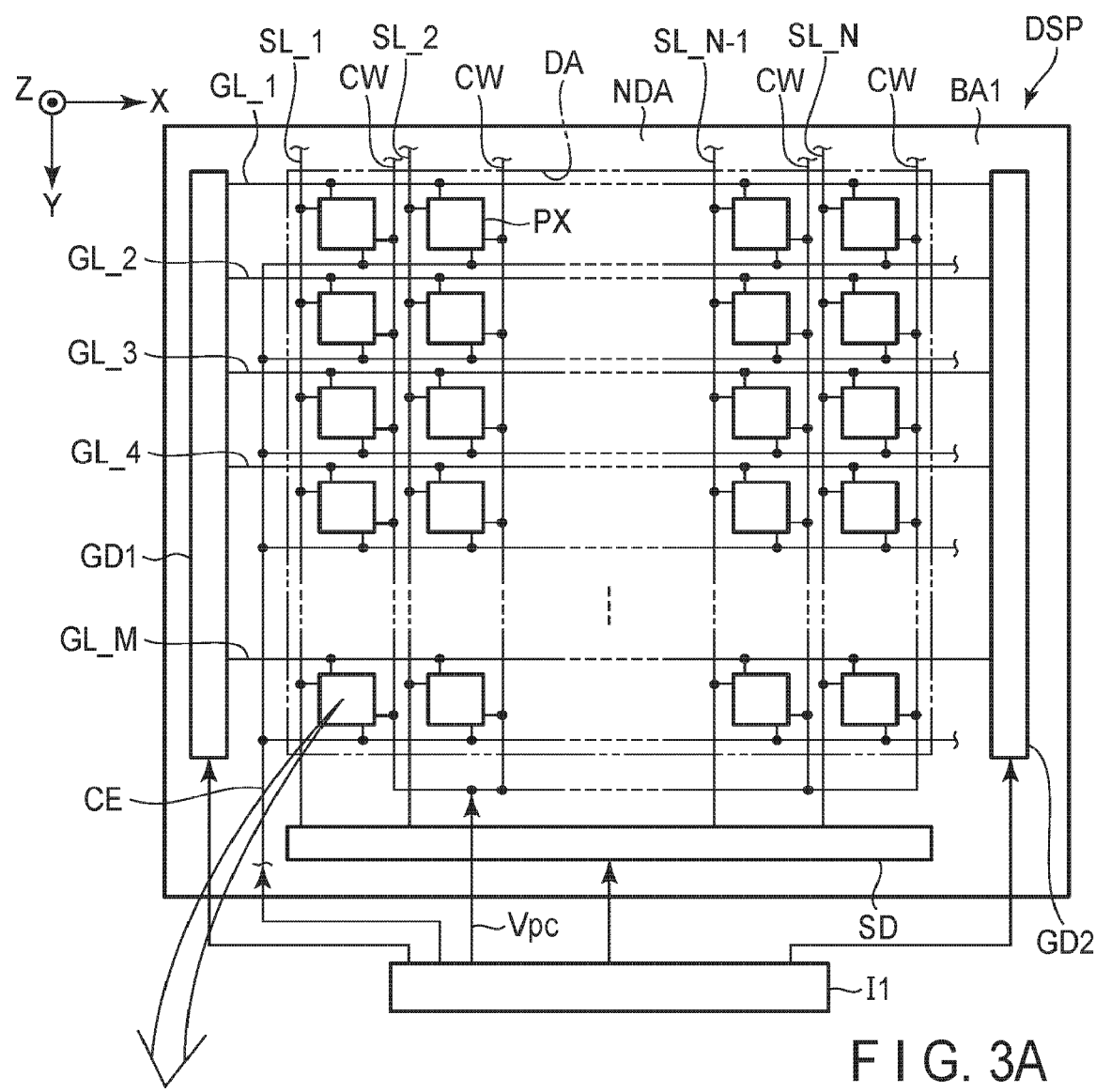
F I G. 3A
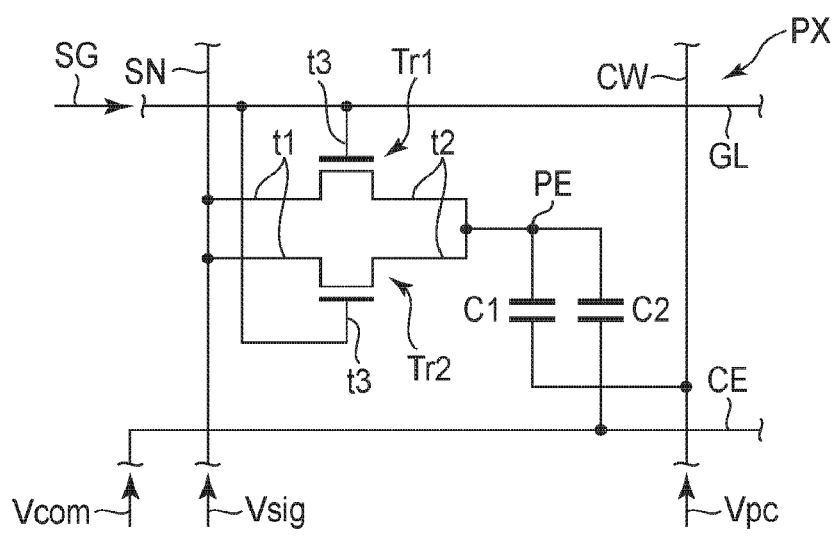
F I G. 3B

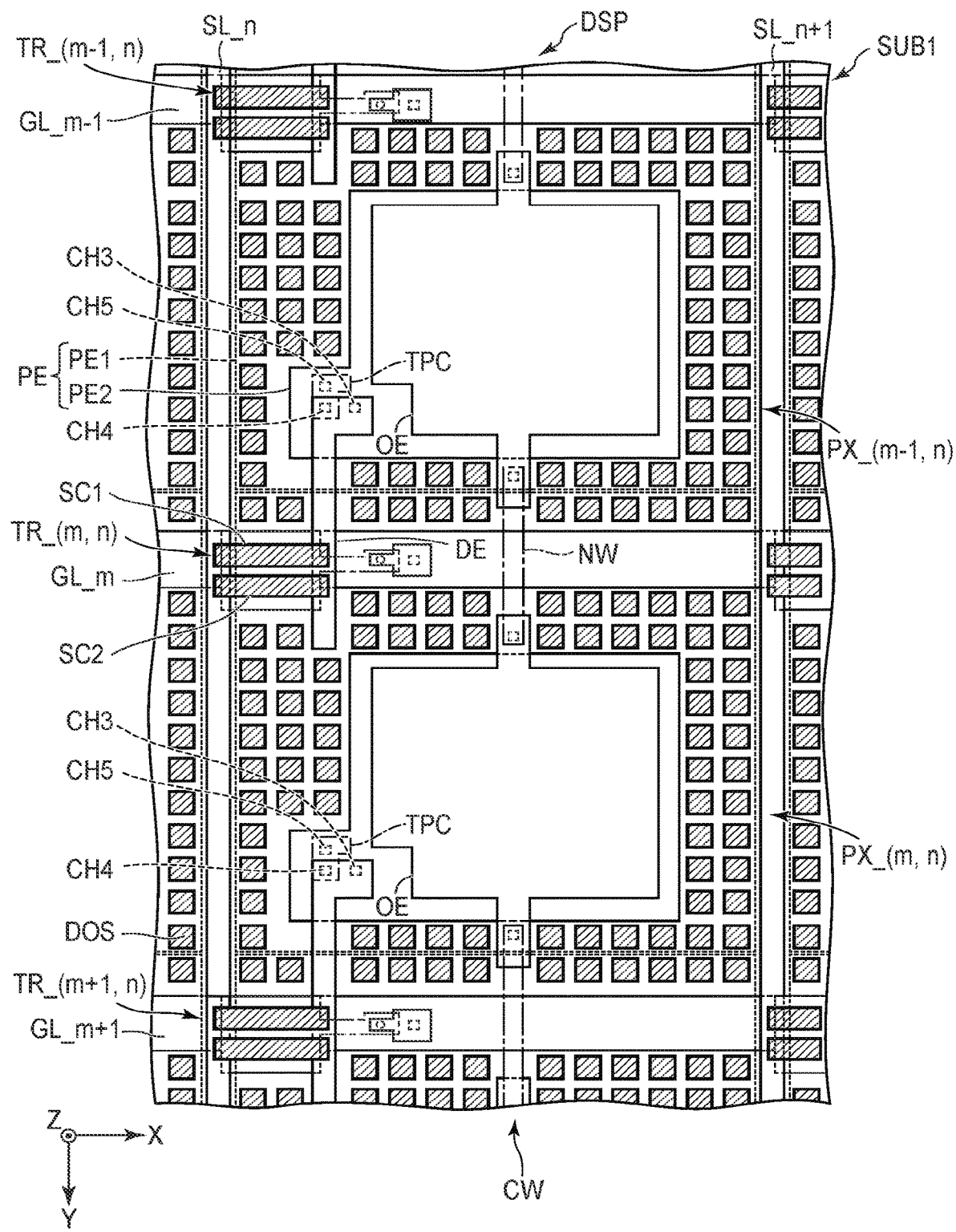
F I G. 5

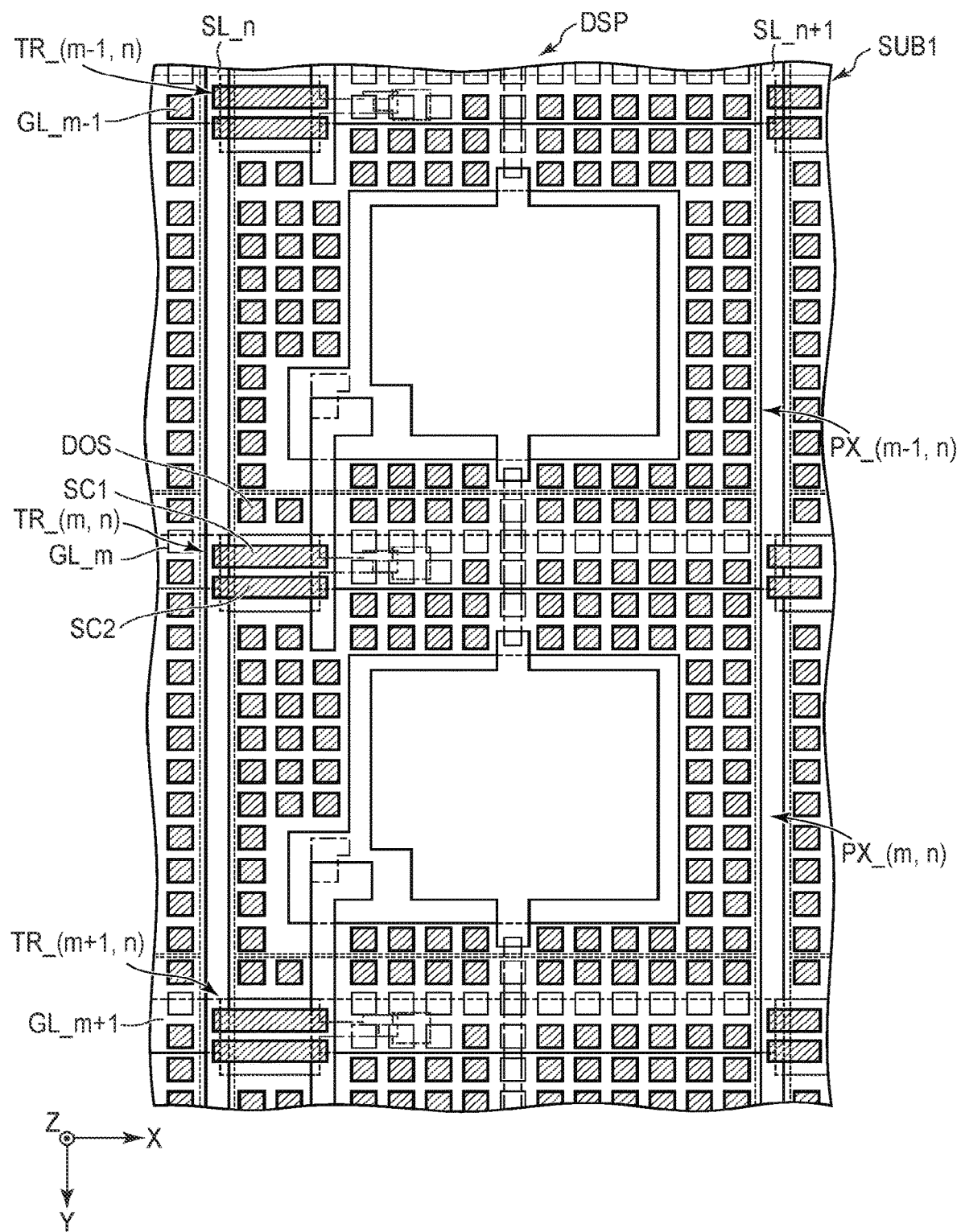
F I G. 6

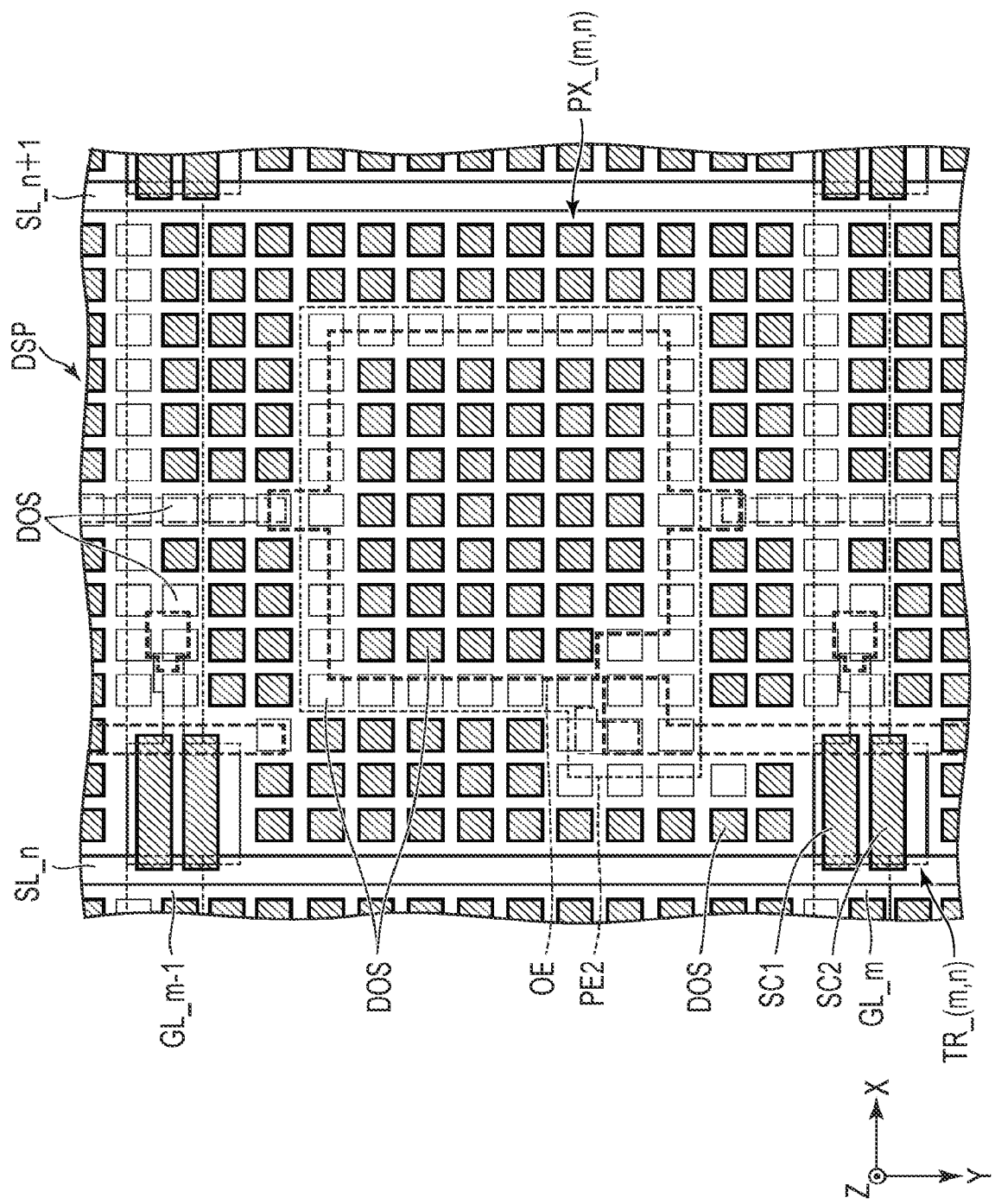
F I G. 9

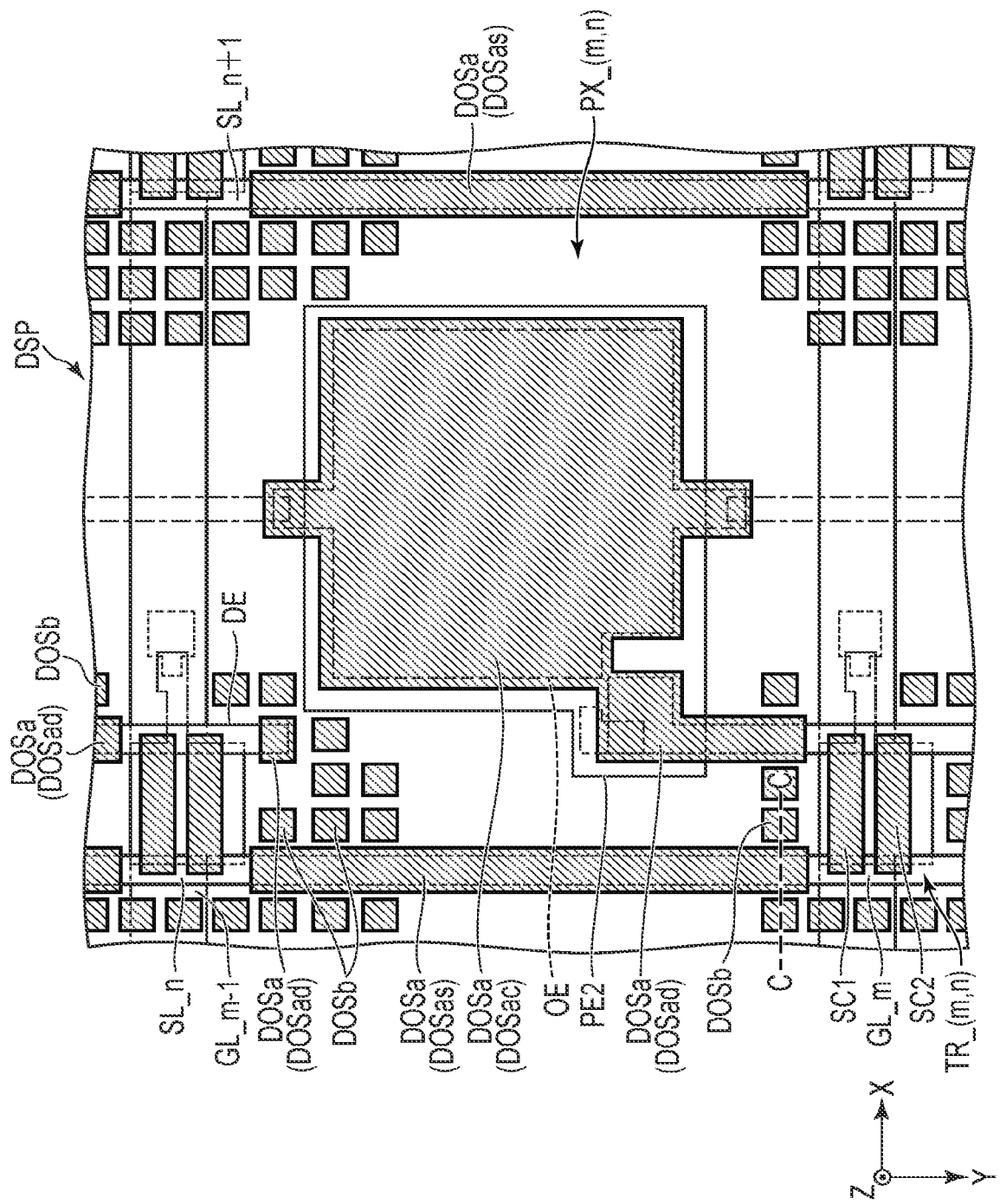
F I G. 10

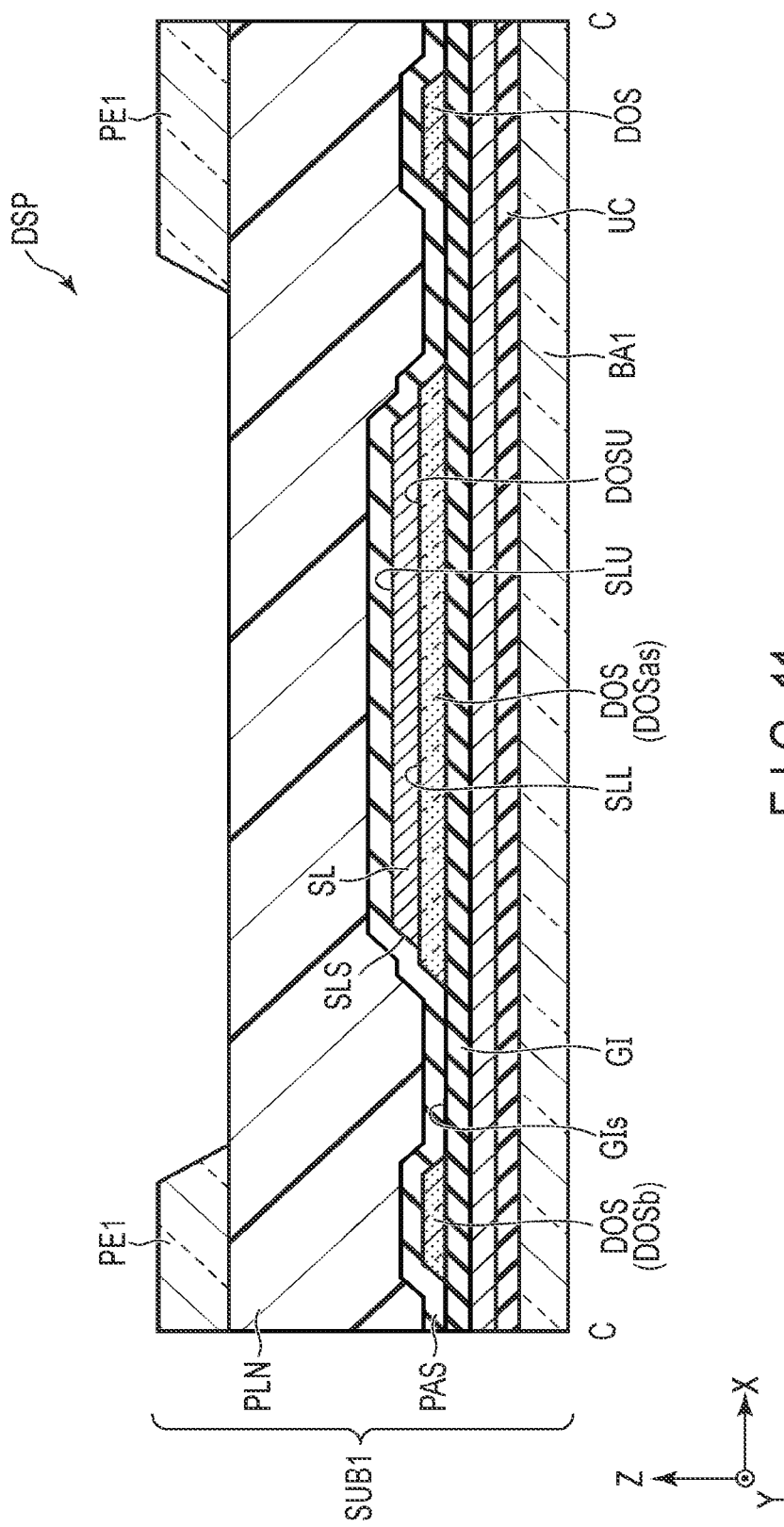
F I G. 11

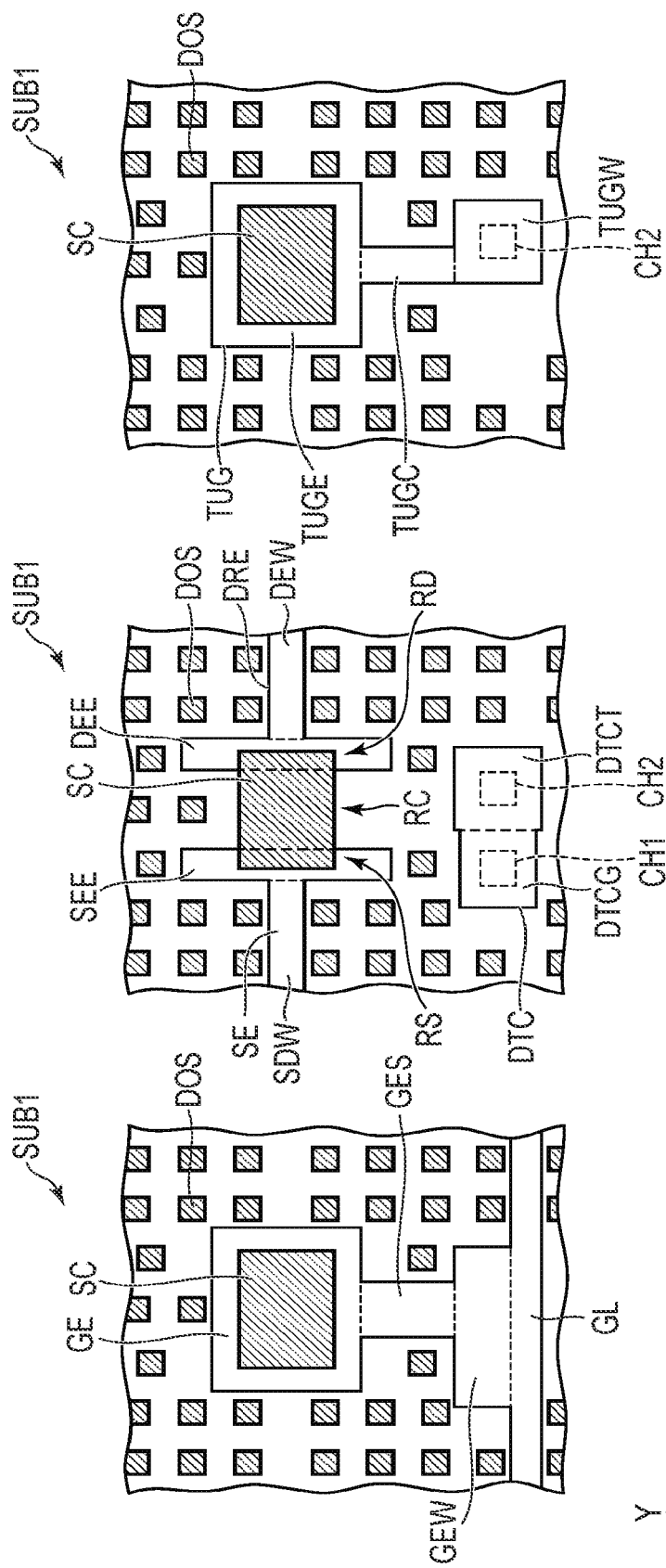

_US 11,682,732 B2_

SEMICONDUCTOR SUBSTRATE AND DISPLAY DEVICE

CROSS-REFERENCE TO RELATED APPLICATIONS

This application is based upon and claims the benefit of priority from Japanese Patent Application No. 2020-033370, filed Feb. 28, 2020, the entire contents of which are incorporated herein by reference.

FIELD

Embodiments described herein relate generally to a semiconductor substrate and a display device.

BACKGROUND

As a display device, for example, an electrophoretic display device is known. In the electrophoretic display device, a thin-film transistor is used as a switching element.

BRIEF DESCRIPTION OF THE DRAWINGS

FIG. 2 is a cross-sectional view showing a semiconductor substrate SUB1 along line A-A of FIG. 1.

FIG. 3A is a circuit diagram showing a display device DSP of the present embodiment.

FIG. 3B is a circuit diagram showing one pixel PX of the display device DSP of FIG. 3A.

FIG. 5 is an enlarged plan view showing a part of the substrate SUB1 of the display device DSP.

FIG. 6 is a plan view showing another configuration example in the present embodiment.

FIG. 9 is a plan view showing another configuration example in the present embodiment.

FIG. 10 is a plan view showing another configuration example in the present embodiment.

FIG. 11 is a cross-sectional view of the display device DSP along line C-C of FIG. 10.

FIG. 13A is a plan view showing the positional relationship between a semiconductor layer SC and a semiconductor layer DOS, and a wiring layer in the same layer as a gate electrode GE.

FIG. 13B is a plan view showing the positional relationship between the semiconductor layer SC and the semiconductor layer DOS, and wiring layers in the same layer as a source electrode SE and a drain electrode DRE.

FIG. 13C is a plan view showing the positional relationship between the semiconductor layer SC and the semiconductor layer DOS, and a wiring layer in the same layer as an auxiliary gate electrode TUG.

DETAILED DESCRIPTION

Figure 1:
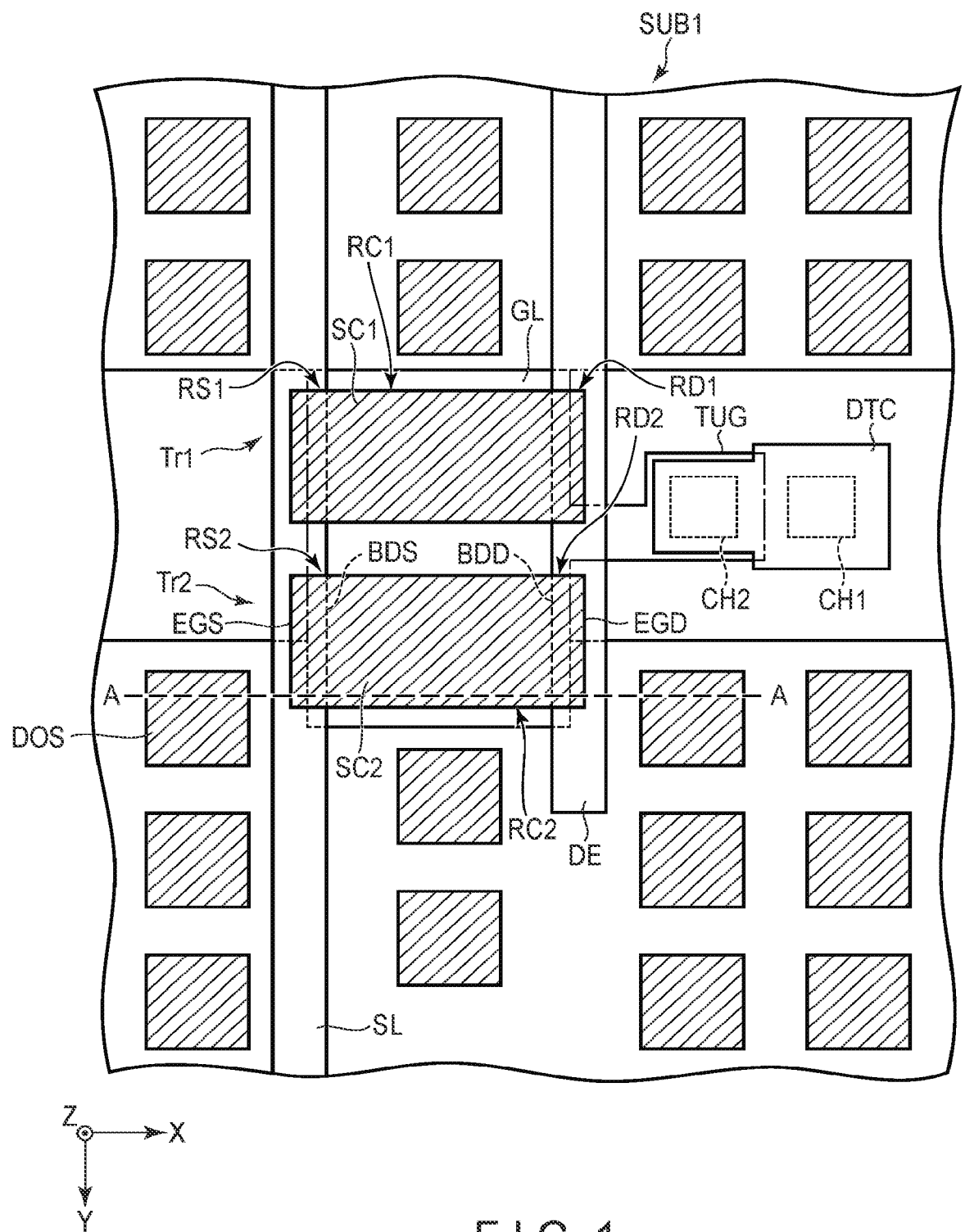
FIG. 1 is a plan view of a semiconductor substrate of the present embodiment.

In general, according to one embodiment, a semiconductor substrate includes a base, a scanning line disposed over the base, a signal line disposed over the base, a transistor overlapping the scanning line and the signal line and including a first oxide semiconductor layer connected to the signal line, and a plurality of second oxide semiconductor layers disposed in a same layer as the first oxide semiconductor. The second oxide semiconductor layers are disposed around the transistor. The second oxide semiconductor layers are floating.

According to another embodiment, a display device includes: a semiconductor substrate including a first base, a scanning line disposed over the first base, a signal line disposed over the first base, a transistor overlapping the scanning line and the signal line and including a first oxide semiconductor layer connected to the signal line, a pixel electrode electrically connected to the transistor, and a second oxide semiconductor layer disposed in a same layer as the first oxide semiconductor layer; a counter-substrate including a second base opposed to the pixel electrode, and a counter-electrode located between the second base and the pixel electrode and opposed to the pixel electrode; and a display function layer located between the pixel electrode and the counter-electrode and subjected to a voltage applied between the pixel electrode and the counter-electrode. The second oxide semiconductor layer is disposed close to the transistor. The second oxide semiconductor layer is electrically floating.

According to the present embodiment, a semiconductor substrate having transistor characteristics excellent in stability, and a display device including the semiconductor substrate can be provided.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like of the respective parts are illustrated schematically in the drawings, rather than as an accurate representation of what is implemented. However, such schematic illustration is merely exemplary, and in no way restricts the interpretation of the invention. In addition, in the specification and drawings, elements similar to those described in connection with preceding drawings are denoted by the same reference numbers, and detailed description of them is omitted unless necessary.

A semiconductor substrate and a display device according to one embodiment will be described hereinafter with reference to the accompanying drawings.

In the present embodiment, a first direction X, a second direction Y and a third direction Z are orthogonal to one another. However, they may cross one another at an angle other than 90 degrees. A direction toward the tip of an arrow indicating the third direction Z is defined as an upper side or above, and a direction on an opposite side to the direction toward the tip of the arrow indicating the third direction Z is defined as a lower side or below.

In addition, when described as "the second member above the first member" and "the second member below the first member", the second member may be in contact with the first member or apart from the first member. In the latter case, the third member may be interposed between the first member and the second member. On the other hand, when described as "the second member on the first member" and "the second member under the first member", the second member is in contact with the first member.

Furthermore, an observation position from which a semiconductor substrate SUB1 is observed is assumed to be located on a side on which the tip of the arrow indicating the third direction Z is located, and viewing toward an XY-plane defined by the first direction X and the second direction Y from the observation position is referred to as planar view. Viewing a cross section of the semiconductor substrate SUB1 in an XZ-plane defined by the first direction X and the third direction Z or a YZ-plane defined by the second direction Y and the third direction Z is referred to as cross-sectional view.

FIG. 1 is a plan view of a semiconductor substrate of the present embodiment.

As shown in FIG. 1, a scanning line GL is disposed extending in the first direction X. A signal line SL is disposed extending in the second direction Y. Thin-Film Transistors (TFTs) Tr1 and Tr2 (hereinafter referred to as transistors Tr1 and Tr2) are disposed at the intersection of the scanning line GL and the signal line SL. In the present embodiment, the transistors Tr1 and Tr2 may be referred to simply as transistors Tr when the transistors Tr1 and Tr2 do not have to be differentiated from each other.

A semiconductor layer SC1 of the transistor Tr1 and a semiconductor layer SC2 of the transistor Tr2 are such that semiconductor layers having long sides and short sides and having substantially the same shape (substantially the same area) are disposed parallel to each other.

The semiconductors SC1 and SC2 may be referred to simply as semiconductor layers SC when the semiconductors SC1 and SC2 do not have to be differentiated from each other.

In addition, the transistors Tr are not limited to the two transistors Tr1 and Tr2 as described above but may be three transistors Tr including a transistor Tr3 in addition to the transistors Tr1 and Tr2 or more than three transistors Tr.

Similarly, the semiconductor layers SC are not limited to the two semiconductor layers SC1 and SC2 as described above, but three or more semiconductor layers may be disposed in parallel according to the number of transistors.

The semiconductor layer SC1 of the transistor Tr1 and the semiconductor layer SC2 of the transistor Tr2 include a region RS1 and a region RS2 which overlap the signal line SL in planar view, respectively. The semiconductor layer SC1 and the semiconductor layer SC2 include a region RD1 and a region RD2 which overlap a connection electrode DE (drain electrode) in planar view, respectively.

The semiconductor layer SC1 includes a channel forming region RC1 between the region RS1 and the region RD1. The semiconductor layer SC2 includes a channel forming region RC2 between the region RS2 and the region RD2. The entire channel forming regions RC1 and RC2 of the semiconductor layers SC1 and SC2 overlap the same scanning line GL.

In the present embodiment, a part other than the channel forming region RC2 of the semiconductor layer SC2 may not overlap the scanning line GL. Since the semiconductor layer SC2 functions as a transistor as long as the channel forming region RC2 of the semiconductor layer SC2 overlaps the scanning line GL, a part except the channel forming region RC2 of the semiconductor layer SC2 from the scanning line GL (more specifically, a part of the region RS2 and a part of the region RD2) is exposed from the scanning line GL. Accordingly, a load caused by a capacitance formed by a gate electrode (scanning line GL) and the signal line SL and the connection electrode DE can be reduced.

In other words, in the semiconductor substrate SUB1 shown in FIG. 1, an area in which the scanning line GL, the semiconductor layer SC2, the signal line SL and the connection electrode DE overlap one another is reduced. In addition, the semiconductor layer including the region which partly does not overlap the scanning line GL may be the semiconductor layer SC1. In that case, the entire semiconductor layer SC2 overlaps the same scanning line GL.

Furthermore, "substantially" of the above description "substantially the same shape (substantially the same area)" means that the shape (area) is the same under a design concept but the shape (area) may slightly vary due to a manufacturing process since it is difficult to manufacture ideally with the uniform and same shape (area).

Furthermore, a connection electrode DTC is disposed in the semiconductor substrate SUB1 shown in FIG. 1. The connection electrode DTC overlaps the scanning line GL and is located spaced from the signal line SL in the first direction X. The connection electrode DTC is formed of the same material as the signal line SL and the connection electrode DE. The connection electrode DTC is connected to the scanning line GL in a contact hole CH1.

An auxiliary gate electrode TUG overlaps the scanning line GL, the connection electrode DTC and the connection electrode DE in planar view. The auxiliary gate electrode TUG only has to overlap both of the channel forming regions RC1 and RC2 of the semiconductor layers SC1 and SC2 in planar view. In the present embodiment, the auxiliary gate electrode TUG overlaps the entire channel forming regions RC1 and RC2 of the semiconductor layers SC1 and SC2.

In addition, the auxiliary gate electrode TUG is connected to the connection electrode DTC in a contact hole CH2. Accordingly, the auxiliary gate electrode TUG is electrically connected to the scanning line GL via the connection electrode DTC.

However, the auxiliary gate electrode TUG, the connection electrode DTC, the contact hole CH1 and the contact hole CH2 may not be disposed.

As shown in FIG. 1, a plurality of semiconductor layers DOS which do not overlap any of the signal line SL, the scanning line GL, the connection electrode DE, the semiconductor layer SC1 and the semiconductor layer SC2 are disposed in the semiconductor substrate SUB1. The semiconductor layers DOS are disposed in the same layer as the semiconductor layers SC1 and SC2. Each of the semiconductor layers DOS has an island shape in planar view.

In the present embodiment, a layer formed of the same material and in the same process is referred to as the same layer. As will be described later, the semiconductor layer SC (semiconductor layers SC1 and SC2) and the semiconductor layer DOS are disposed between an insulating layer GI and an insulating layer PAS in cross-sectional view.

The semiconductor layer DOS is not electrically connected to anything. The semiconductor layer DOS is electrically independent, that is, floating. The semiconductor layer DOS is a so-called dummy semiconductor layer. The details of the semiconductor layer DOS will be described later.

FIG. 2 is a cross-sectional view showing the semiconductor substrate SUB1 along line A-A of FIG. 1. The semiconductor substrate SUB1 shown in FIG. 2 includes the transistor Tr2 and the semiconductor layer DOS. In the transistor Tr2, a base BA1, an insulating layer UC, the scanning line GL (gate electrode), an insulating layer GI, the semiconductor layer SC2, the signal line SL and the connection electrode DE, an insulating layer PAS, the auxiliary gate electrode TUG and an insulating layer PLN are stacked in this order in the third direction Z. The signal line SL and the connection electrode DE are formed of the same material.

Although only the transistor Tr2 is shown in FIG. 2, the transistor Tr1 also has a similar configuration.

In addition, as shown in FIG. 2, the base BA1, the insulating layer UC, the insulating layer GI, the semiconductor layer DOS, the insulating layer PAS and the insulating layer PLN are stacked in this order in the third direction Z.

A pixel electrode PE1 is disposed on the insulating layer PLN. Note that the insulating layer UC does not have to be disposed.

The semiconductor layer SC2 and the semiconductor layer DOS are disposed on the insulating layer GI. The insulating layer GI includes a first surface GIs which is a surface on a signal line SL side. The semiconductor layer SC2 and the semiconductor layer DOS are in contact with the first surface GIs. The signal line SL and the connection electrode DE are disposed on the insulating layer GI on which the semiconductor layer SC2 is formed.

The signal line SL is located on the region RS2 of the semiconductor layer SC2, is in contact with the region RS2, and is electrically connected to the region RS2. The connection electrode DE is located on the region RD2 of the semiconductor layer SC2, is in contact with the region RD2, and is electrically connected to the region RD2.

The insulating layer PAS is formed on the insulating layer GI, the semiconductor layer SC2 and the semiconductor layer DOS, and the signal line SL and the connection electrode DE. The auxiliary gate electrode TUG is disposed on the insulating layer PAS.

The insulating layer UC, the insulating layer GI and the insulating layer PAS are inorganic insulating layers using oxide such as silicon oxide ($SiO_2$) or nitride such as silicon nitride (SiN). The insulating layer US, the insulating layer GI and the insulating layer PAS are not limited to a single layer but may be composed of a plurality of insulating layers stacked on top of each other. For example, a film of silicon oxide and silicon nitride stacked on top of each other may be used as the insulating layer UC, a silicon oxide film may be used as the insulating layer GI, and a film of silicon oxide and silicon nitride stacked on top of each other may be used as the insulating layer PAS.

In addition, the insulating layer PLN may use an organic resin layer, more specifically, acrylic resin or polyimide resin.

The scanning line GL, the signal line SL, the connection electrode DE, the connection electrode DTC and the auxiliary gate electrode TUG are formed of a metal material such as aluminum (Al), titanium (Ti), silver (Ag), molybdenum (Mo), tungsten (W), copper (Cu) or chromium (Cr), an alloy of these metal materials combined together or the like. In addition, they may have a single-layer structure of the metal material or the alloy or a multilayer structure of the metal materials arbitrarily stacked on top of each other.

The material used as the semiconductor layer SC2 (and the semiconductor layer SC1) and the semiconductor layer DOS of the present embodiment is oxide semiconductor.

In a transistor including oxide semiconductor as a semiconductor layer (hereinafter referred to also as an oxide semiconductor transistor), an off-state leakage current is extremely small. When the oxide semiconductor transistor is used as a switching element in a pixel of a display device, an electric charge written to a pixel capacitance can be held for a long time, and a desired voltage can be continuously held.

However, the oxide semiconductor transistor has a problem that, when a channel forming region is insufficiently oxidized, a threshold value Vth of the transistor is greatly shifted in a negative direction (depleted), and switching characteristics are not exhibited.

One of the causes for insufficient oxidation of the channel forming region is that elements around the oxide semiconductor layer extract oxygen from the oxide semiconductor layer and deoxidize the oxide semiconductor layer. For example, a metal line disposed around the oxide semiconductor layer deoxidizes the oxide semiconductor layer by extracting oxygen from the oxide semiconductor layer, and the metal line itself is oxidized. Accordingly, the channel forming region of the oxide semiconductor transistor is made insufficiently oxidized, and the oxide semiconductor transistor may not exhibit transistor characteristics.

In FIG. 2, the signal line SL is directly in contact with the semiconductor layer SC of the transistor Tr (more specifically, the semiconductor layer SC2 of the transistor Tr2). When the signal line SL which is metal is directly in contact with the semiconductor layer SC which is an oxide semiconductor layer, the signal line SL extracts oxygen of the semiconductor layer SC as described above (in other words, deoxidizes the semiconductor layer SC) and may make the semiconductor layer SC insufficiently oxidized.

Furthermore, for example, when easily-oxidizable aluminum is used as the metal line, aluminum takes oxygen away from around it, and aluminum itself is oxidized and others are deoxidized. Therefore, when aluminum is used as the signal line SL, the signal line SL takes oxygen away from the semiconductor layer SC which is directly in contact with the signal line SL, and the transistor characteristics may be degraded or destroyed.

Therefore, in the present embodiment, the dummy semiconductor layer DOS is disposed close to the semiconductor layer SC so that the metal line, for example, the signal line SL does not extract oxygen from the semiconductor layer SC. Since the semiconductor layer DOS supplies oxygen, extraction of oxygen from the semiconductor layer SC (deoxidization) is suppressed, and degradation of the transistor characteristics can be suppressed.

As shown in FIG. 2, both the semiconductor layer DOS and the signal line SL are in contact with the insulating layer PAS. Oxygen in the semiconductor layer DOS is extracted by the signal line SL via the insulating layer PAS. Therefore, the insulating layer PAS is preferably an insulating layer through which oxygen can move, for example, an insulating layer containing oxygen, more specifically, silicon oxide. The insulating layer PAS may be composed of, for example, two layers stacked such that the lower layer is a silicon oxide layer and the upper layer is a silicon nitride layer.

As shown in FIGS. 1 and 2, the semiconductor layer DOS of the present embodiment is disposed around the transistor Tr. More specifically, the semiconductor layer DOS is disposed close to the semiconductor layer SC of the transistor Tr and does not overlap the signal line SL, the scanning line GL, the connection electrode DE, the connection electrode DTC and the auxiliary gate electrode TUG in planar view. In other words, the semiconductor layer DOS is disposed in a region of the substrate SUB1 in which the signal line SL, the scanning line GL, the connection electrode DE, the connection electrode DTC and the auxiliary gate electrode TUG are not disposed. It can be said that the semiconductor layer DOS of the present embodiment does not overlap the semiconductor layer SC and one semiconductor layer DOS does not overlap at least either of the scanning line GL and the signal line SL.

In the present embodiment, the semiconductor layer SC may be referred to as the first semiconductor layer or the first oxide semiconductor layer, and the semiconductor layer DOS may be referred to as the second semiconductor layer or the second oxide semiconductor layer. The semiconductor layer SC is one of the constituent elements of the transistor Tr, and is applied to a voltage (signal) from the signal line SL and the scanning line GL. On the other hand, the semiconductor layer DOS is not applied to a voltage from the signal line SL and the scanning line GL and is electrically independent, that is, floating.

As described above, the signal line SL, the scanning line GL, the connection electrode DE, the connection electrode DTC and the auxiliary gate electrode TUG are formed of a metal material and block visible light. Therefore, it can be said that the semiconductor layer DOS of the present embodiment is disposed in a region in which visible light is not blocked, that is, a visible light transmission region.

An oxide semiconductor layer is substantially transparent to visible light and does not interfere with light transmission even when it is disposed in the visible light transmission region. Therefore, even when the substrate SUB1 is used in a display device, it does not have any impact on display quality.

In FIG. 2, the size of the semiconductor layer DOS is smaller than the size of the semiconductor layer SC. By making the semiconductor layer DOS small as described above, it is possible to dispose the semiconductor layer DOS close to the semiconductor layer SC. By disposing the semiconductor layer DOS close to the semiconductor layer SC, it is possible to suppress deoxidization of the semiconductor layer SC. However, the size of the semiconductor layer DOS is not limited to this but may be the same as the size of the semiconductor layer SC or greater than the size of the semiconductor layer SC. When the semiconductor layer DOS is large, for example, the signal line SL can extract more oxygen from the semiconductor layer DOS, and therefore oxygen extracted from the semiconductor layer SC can be reduced.

In the present embodiment, a rectangular semiconductor layer is described as the semiconductor layer DOS having an island shape in planar view. However, the shape of the semiconductor layer DOS is not limited to this. The semiconductor layer DOS may have a circular shape, an elliptical shape, a square shape or another rectangular shape, a polygonal shape or a mesh shape.

In addition, the semiconductor layer DOS and the semiconductor layer SC having the same thickness (length in the third direction Z) are described in the present embodiment. However, the semiconductor layer DOS and the semiconductor layer SC are not limited to this and may have different thicknesses. For example, the thickness of the semiconductor DOS may be greater than the thickness of the semiconductor layer SC. When the semiconductor layer DOS is thick, the semiconductor layer DOS supplies more oxygen than the semiconductor layer SC. Accordingly, extraction of oxygen from the semiconductor layer SC can be further suppressed.

Now, the details of the positional relationship among the semiconductor layer SC, the signal line SL and the auxiliary gate electrode TUG will be described.

As shown in FIG. 2, in the region RS2 of the semiconductor layer SC2, the boundary between the region RS2 and the channel forming region RC2 is referred to as a boundary BDS, and an end portion opposed in the first direction X to the boundary BDS is referred to as an end portion EGS. In the region RD2 of the semiconductor layer SC2, the boundary between the region RD2 and the channel forming region RC2 is referred to as a boundary BDD, and an end portion opposed in the first direction X to the boundary BDD is referred to as an end portion EGD. Although the positional relationship among the semiconductor layer SC2, the signal line SL and the auxiliary gate electrode TUG will be described here, the semiconductor layer SC1, the signal line SL and the auxiliary gate electrode TUG also have a similar positional relationship.

The channel forming region RC2 of the semiconductor layer SC2 completely overlaps the auxiliary gate electrode TUG. In addition, as described above, the channel forming region RC2 also completely overlaps the scanning line GL.

The region RS2 of the semiconductor layer SC2 completely overlaps the signal line SL. A part of the region RS2 overlaps the auxiliary gate electrode TUG, and the other part does not overlap. That is, the region RS2 includes a region which overlaps the signal line SL but does not overlap the auxiliary gate electrode TUG. In addition, the end portion EGS of the region RS2 does not match an end portion of the signal line SL, and does not match an end portion of the auxiliary gate electrode TUG. The end portion EGS of the region RS2 is located between the end portion of the signal line SL and the end portion of the auxiliary gate electrode TUG.

The region RD2 of the semiconductor layer SC2 completely overlaps the connection electrode DE. A part of the region RD2 overlaps the auxiliary gate electrode TUG, and the other part does not overlap. That is, the region RD2 includes a region which overlaps the connection electrode DE but does not overlap the auxiliary gate electrode TUG. In addition, the end portion EGD of the region RD2 does not match an end portion of the connection electrode DE, and does not match an end portion of the auxiliary gate electrode TUG. The end portion EGD of the region RD2 is located between the end portion of the connection electrode DE and the end portion of the auxiliary gate electrode TUG.

Furthermore, in FIG. 2, the pixel electrode PE1 is disposed on the insulating layer PLN. The pixel electrode PE1 is located above the base BA1, the scanning line GL and the signal line SL.

The pixel electrode PE1 is composed of a transparent conductive layer or a light reflective layer, or a light reflective layer and a transparent conductive layer stacked on top of each other.

The transparent conductive layer is formed of a transparent conductive material such as indium tin oxide (ITO) or indium zinc oxide (IZO).

The light reflective layer is formed of a metal material such as Al, Ti, Ag, Mo, W, Cu or Cr, an alloy of these metal materials combined together or the like, and may have a single-layer structure or a multilayer structure of these metal materials arbitrarily stacked on top of each other.

Now, a display device including the transistor Tr and the semiconductor layer DOS of the present embodiment will be described. FIG. 3A is a circuit diagram showing a display device DSP of the present embodiment. FIG. 3B is a circuit diagram showing one pixel PX of the display device DSP of FIG. 3A. Not all pixels PX and all wiring lines are shown in FIGS. 3A and 3B.

The display device DSP includes a display region DA which displays an image and a non-display region NDA other than the display region DA. In the present embodiment, the non-display region NDA is formed in a frame shape.

As shown in FIG. 3A, the display device DSP includes the base BA1, a plurality of pixels PX arrayed in a matrix above the base BA1 in the display area DA, a plurality of scanning lines GL, a plurality of signal lines SL, and a plurality of capacitance lines CW. The scanning lines and the signal lines are referred to also as gate lines and source lines, respectively.

In the present embodiment, the number of scanning lines GL is assumed to be M, and the scanning lines GL are referred to as scanning lines GL_1 to GL_M.

However, they are referred to simply as scanning lines GL when they do not have to be differentiated from one another. In addition, the number of signal lines SL is assumed to be N, and the signal lines SL are referred to as signal lines SL_1 to SL_N. However, they are referred to simply as signal lines SL when they do not have to be differentiated from one another. That is, the display device DSP includes M rows by N columns of pixels PX.

The display device DSP includes scanning line driving circuits GD1 and GD2 (referred to also as gate drivers) and a signal line driving circuit SD (referred to also as a source driver). The scanning line driving circuits GD1 and GD2 drive the scanning lines GL which will be described later. The scanning line driving circuits GD1 and GD2 are disposed in the non-display area NDA. The signal line driving circuit SD drives the signal lines SL. The signal line driving circuit SD is disposed in the non-display area NDA.

The scanning lines GL are connected to the scanning line driving circuit GD, extend in the first direction X, and are disposed in the second direction Y. The scanning lines GL are electrically connected to the pixels PX disposed in the first direction X. The signal lines SL are connected to the signal line driving circuit SD, extend in the second direction Y and are disposed in the first direction X. The signal lines SL are each electrically connected to the pixels PX disposed in the second direction Y. The capacitance lines CW extend in the first direction X or the second direction Y. In the present embodiment, the capacitance lines CW extend in the second direction Y and are electrically connected to the pixels PX disposed in the second direction Y. The capacitance lines CW are bundled together in the non-display area NDA and are connected to an IC chip I1.

The scanning line driving circuit GD supplies a control signal SG to the scanning lines GL and drives the scanning lines GL. The signal line driving circuit SD supplies an image signal (for example, a video signal) Vsig to the signal lines SL and drives the signal lines SL. The IC chip I1 supplies a constant voltage Vpc to the capacitance lines CW, and the capacitance lines CW are fixed to a constant potential. In addition, the IC chip I1 supplies a common voltage Vcom to a counter-electrode CE, and the counter-electrode CE is fixed to a constant potential (common potential). In the present embodiment, since the counter-electrode CE is shared among all the pixels PX, the counter-electrode CE may be referred to as a common electrode. In the present embodiment, the capacitance lines CW are set to the same potential as the counter-electrode CE. However, the capacitance lines CW may be set to a potential different from that of the counter-electrode CE. The scanning line driving circuit GD, the signal line driving circuit SD and the IC chip I1 constitute a driving unit for driving the pixels PX.

As shown in FIG. 3B, each pixel PX includes the transistor Tr1, the transistor Tr2, a first capacitance C1 and a second capacitance C2. Each of the transistors Tr1 and Tr2 is an oxide semiconductor transistor in which the semiconductor layer SC is oxide semiconductor as described above.

Each of the transistors Tr1 and Tr2 includes a first terminal t1, a second terminal t2 and a control terminal t3. In the present embodiment, the control terminal t3 functions as a gate electrode, one of the first terminal t1 and the second terminal t2 functions as a source electrode, and the other of the first terminal t1 and the second terminal t2 functions as a drain electrode. The transistors Tr1 and Tr2 are electrically connected in parallel between the signal line SL and the pixel electrode PE.

In each of the transistors Tr1 and Tr2, the first terminal t1 is connected to the signal line SL, the second terminal t2 is connected to the pixel electrode PE, and the control terminal t3 is connected to the scanning line GL. Accordingly, each of the transistors Tr1 and Tr2 is switched to a conductive state or a non-conductive state by the control signal SG supplied to the scanning line GL. The image signal Vsig is applied to the pixel electrode PE via the signal line SL and the transistors Tr1 and Tr2 in the conductive state.

The first capacitance C1 and the second capacitance C2 are capacitors. The first capacitance C1 is connected between the pixel electrode PE and the capacitive line CW. The second capacitance C2 is connected between the pixel electrode PE and the counter-electrode CE.

Figure 4:
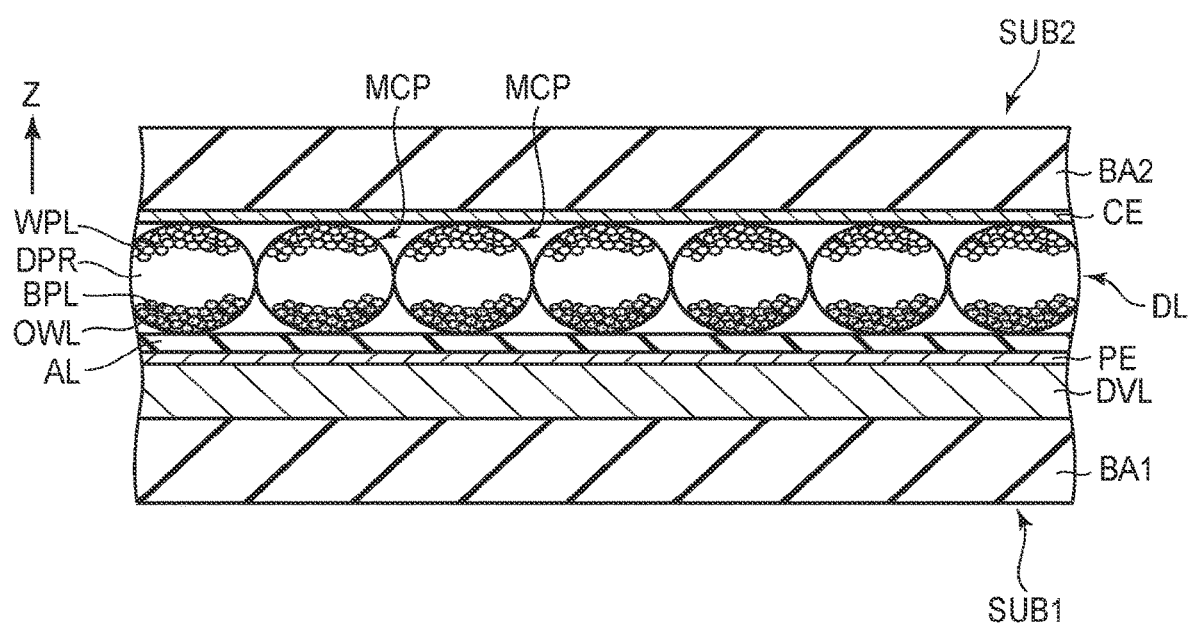
FIG. 4 is a cross-sectional view showing the display device DSP.

FIG. 4 is a cross-sectional view showing the display device DSP. The explanation here focuses on one pixel PX.

As shown in FIG. 4, the substrate SUB1 includes the base BA1, a driving element layer DVL disposed on the base BA1, and the pixel electrode PE disposed on the driving element layer DVL.

The driving element layer DVL includes the transistors Tr1 and Tr2, the scanning line GL, the signal line SL, the respective wiring layers, the respective insulating layers and the like.

A substrate SUB2 includes a base BA2 opposed to the pixel electrode PE, and the counter-electrode CE located between the base BA2 and the pixel electrode PE and opposed to the pixel electrode PE. The counter-electrode CE is formed of a transparent conductive material such as indium tin oxide (ITO) or indium zinc oxide (IZO).

In the present embodiment, the substrate SUB1 is a semiconductor substrate and the substrate SUB2 is a counter-substrate. The bases BA1 and BA2 are formed of an insulating material such as resin or glass. In the present embodiment, the base BA2 is located on a screen side (observation side) and has optical transparency. Since the base BA1 is located on an opposite side to the screen, the base BA1 may be non-transparent or transparent.

A display function layer DL of the display device DSP is located between the pixel electrode PE and the counter-electrode CE. The display function layer DL is subjected to a voltage which is applied between the pixel electrode PE and the counter-electrode CE. In the present embodiment, the display device DSP is an electrophoretic display device, and the display function layer DL is an electrophoretic layer. The display function layer DL is formed of a plurality of microcapsules MCP arrayed almost without any space in between in the XY-plane.

An adhesive layer AL of the display device DSP is located between the pixel electrode PE and the display function layer DL.

The microcapsule MCP is a spherical body having a particle diameter of, for example, about 20 μm to 70 μm. In the illustrated example, for a reason of scale, a large number of microcapsules MCP are disposed between one pixel electrode PE and the counter-electrode CE. However, about one to ten microcapsules MCP are disposed in the pixel PX having a rectangular or polygonal shape whose sides have a length of one to several hundred micrometers.

The microcapsule MCP includes a dispersion medium DPR, a plurality of black particles BPL and a plurality of white particles WPL. The black particles BPL and the white particles WPL may be referred to also as electrophoretic particles. An outer shell portion (wall membrane) OWL of the microcapsule MCP is formed of, for example, transparent resin such as acrylic resin. The dispersion medium DPR is a liquid which disperses the black particles BPL and the white particles WPL in the microcapsule MCP. The black particles BPL are, for example, particles (polymer or colloid) made of a black pigment such as aniline black, and are, for example, positively charged. The white particles WPL are, for example, particles (polymer or colloid) made of a white pigment such as titanium dioxide, and are, for example, negatively charged. Various additives can be added to these pigments as needed. In addition, pigments of colors such as red, green, blue, yellow, cyan and magenta may be used instead of the black particles BPL and the white particles WPL.

In the display function layer DL composed as described above, when the pixel PX displays black, the pixel electrode PE is held at high potential relative to the counter-electrode CE. That is, the potential of the counter-electrode CE is assumed to be a reference potential, and the pixel electrode PE is held at positive polarity. Accordingly, while the positively charged black particles BPL are attracted to the counter-electrode CE, the negatively charged white particles WPL are attracted to the pixel electrode PE. As a result, black is visually recognized when the pixel PX is observed from the counter-electrode CE side. On the other hand, when the pixel PX displays white, the potential of the counter-electrode CE is assumed to be a reference potential, and the pixel electrode PE is held at negative polarity. Accordingly, while the negatively charged white particles WPL are attracted to the counter-electrode CE, the positively charged black particles BPL are attracted to the pixel electrode PE. As a result, white is visually recognized when the pixel PX is observed.

In the present embodiment, the pixel electrode PE is in contact with the adhesive layer AL. However, a protective layer having insulation properties may be interposed between the pixel electrode PE and the adhesive layer AL, and the pixel electrode PE may be protected by the protective layer.

FIG. 5 is an enlarged plan view showing a part of the substrate SUB1 of the display device DSP.

As shown in FIG. 5, the scanning lines GL extend in the first direction X and are disposed in the second direction Y. The signal lines SL extend in the second direction Y and are disposed in the first direction X. The scanning line GL and the signal line SL cross each other. The pixel electrode PE includes a pixel electrode PE1 and a pixel electrode PE2 which are electrically connected to each other. The scanning line GL crosses the pixel electrode PE1. The pixel electrode PE2 is located spaced from the scanning line GL in the second direction Y.

Here, the transistors Tr1 and Tr2 connected to the scanning line GL_m in the mth row and the signal line SL_n in the nth column are referred to as a transistor TR_(m, n) (where m is a natural number of greater than or equal to 1 but less than or equal to M−1 and n is a natural number of greater than or equal to 1 but less than or equal to N−1). The pixel PX including the transistor TR_(m, n) and partitioned by the scanning line GL_m, the scanning line GL_m+1, the signal line SL_n and the signal line SL_n+1 is referred to as a pixel PX (m, n).

In addition, the pixel PX including the transistor TR_(m−1, n) and partitioned by the scanning line GL_m−1, the scanning line GL_m, the signal line SL_n and the signal line SL_n+1 is referred to as a pixel PX (m−1, n). The pixel PX (m, n) and the pixel PX (m−1, n) are adjacent to each other across the scanning line GL_m.

Since the pixels in the nth column will be mainly described below, "n" indicating a column will be omitted unless necessary.

The connection electrode DTC of the pixel PX (m, n) overlaps the scanning line GL_m and is located spaced from the signal line SL_n and the signal line SL_n+1 in the first direction X.

The connection electrode DE of the pixel PX (m, n) extends in the second direction Y. One end portion of the connection electrode DE of the pixel PX (m, n) is located between the signal line SL_n and the connection electrode DE and overlaps the regions RD (the regions RD1 and RD2) of the respective semiconductor layers SC in a region overlapping the scanning line GL_m. The other end portion of the connection electrode DE of the pixel PX (m, n) is disposed over the scanning line GL_m and overlaps the pixel electrode PE2 of the pixel PX (m−1, n) in the previous row.

A capacitance electrode OE is located spaced from the semiconductor layer SC, the signal line SL, the connection electrode DTC and the connection electrode DE, and overlaps the pixel electrode PE1 and the pixel electrode PE2. In the present embodiment, the entire capacitance electrode OE is located inside the pixel electrode PE1 and is located inside the pixel electrode PE2 in planar view. The capacitance electrodes OE of the pixels PX (m, n) and PX (m−1, n) are opposed to each other across the scanning line G_m. The capacitance electrode OE is formed in the same layer as the signal lien SL and the connection electrode DE.

A connection line NW extends in the second direction Y, crosses the scanning line GL, but does not cross the signal line SL. The connection line NW connects two capacitance electrodes OE which are adjacent to each other in the second direction Y across the scanning line GL. The connection line NW is formed in the same layer as the auxiliary gate electrode TUG. In the present embodiment, the connection lines NW and the capacitance electrodes OE disposed in the second direction Y are electrically connected and constitute the capacitance line CW.

A connection electrode TPC is located spaced from the auxiliary gate electrode TUG and overlaps the connection electrode DE and the pixel electrode PE1. The connection electrode TPC is electrically connected to the pixel electrode PE1 via a contact hole CH5. The connection electrode TPC is electrically connected to the connection electrode DE via a contact hole CH4.

The connection electrode DE is electrically connected to the pixel electrode PE2 via a contact hole CH3. Accordingly, the connection electrode DE, the connection electrode TPC, the pixel electrode PE1 and the pixel electrode PE2 are electrically connected.

The scanning line GL and the pixel electrode PE2 are formed of the same material. The signal line SL, the connection electrode DE, the connection electrode DTC and the capacitance electrode OE are formed of the same material.

The auxiliary gate electrode TUG and the connection electrode TPC, and the connection line NW are formed of the same material.

In addition, the connection line NW may be formed of the same material as the signal line SL.

That is, the scanning line GL, the pixel electrode PE2, the signal line SL, the connection electrode DE, the connection electrode DTC, the capacitance electrode OE, the connection line NW, the auxiliary gate electrode TUG and the connection electrode TPC are formed of a metal material such as aluminum (Al), titanium (Ti), silver (Ag), molybdenum (Mo), tungsten (W), copper (Cu) or chromium (Cr), an alloy of these metal materials combined together or the like. In addition, they may have a single-layer structure of the metal material or the alloy or a multilayer structure of the metal materials arbitrarily stacked on top of each other.

The semiconductor layer DOS is disposed close to the semiconductor layer SC (the semiconductor layers SC1 and SC2) of the transistor Tr. In addition, the semiconductor layer DOS is disposed in a region which does not overlap the semiconductor layer SC1, the semiconductor layer SC2, the scanning line GL, the pixel electrode PE2, the signal line SL, the connection electrode DE, the connection electrode DTC, the capacitance electrode OE, the connection line NW, the auxiliary gate electrode TUG and the connection electrode TPC.

In the present embodiment, the dummy semiconductor layer DOS is disposed close to the semiconductor layer SC. Accordingly, extraction of oxygen from the semiconductor layer SC of the transistor Tr by the metal line can be suppressed. Consequently, the transistor Tr including the semiconductor layer SC can suppress degradation of the transistor characteristics.

In addition, the display device including the transistor Tr as a switching element can suppress degradation of display quality.

The semiconductor substrate of the above-described embodiment is not limited to the substrate SUB1 but can be applied to various semiconductor substrates.

In addition, the display device DSP of the above-described embodiment is not limited to the above-described electrophoretic display device but can be applied to various display devices. As an example, the display device DSP may be a liquid crystal display device. In that case, the display function layer DL is a liquid crystal layer. The liquid crystal layer may use, for example, polymer dispersed liquid crystal (PDLC).

Configuration Example 1

FIG. 6 is a plan view showing another configuration example in the present embodiment. The configuration example shown in FIG. 6 is different from the configuration example shown in FIG. 5 in that the dummy semiconductor layer is disposed overlapping the scanning line.

In FIG. 6, in order to make the drawing easy to see, the line thickness and the hatching of semiconductor layers DOS overlapping the connection electrode DTC, the auxiliary gate electrode TUG and the connection line NW are changed. However, these semiconductor layers DOS are equivalent to the other semiconductor layers DOS.

In the display device DSP shown in FIG. 6, the semiconductor layer DOS overlaps the scanning line GL in planar view. In addition, in regions in which the connection electrode DTC and the auxiliary gate electrode TUG overlap the scanning line GL, the semiconductor layers DOS overlap the connection electrode DTC and the auxiliary gate electrode TUG.

In addition, the semiconductor layer DOS may overlap the connection line NW in planar view.

Figure 7:
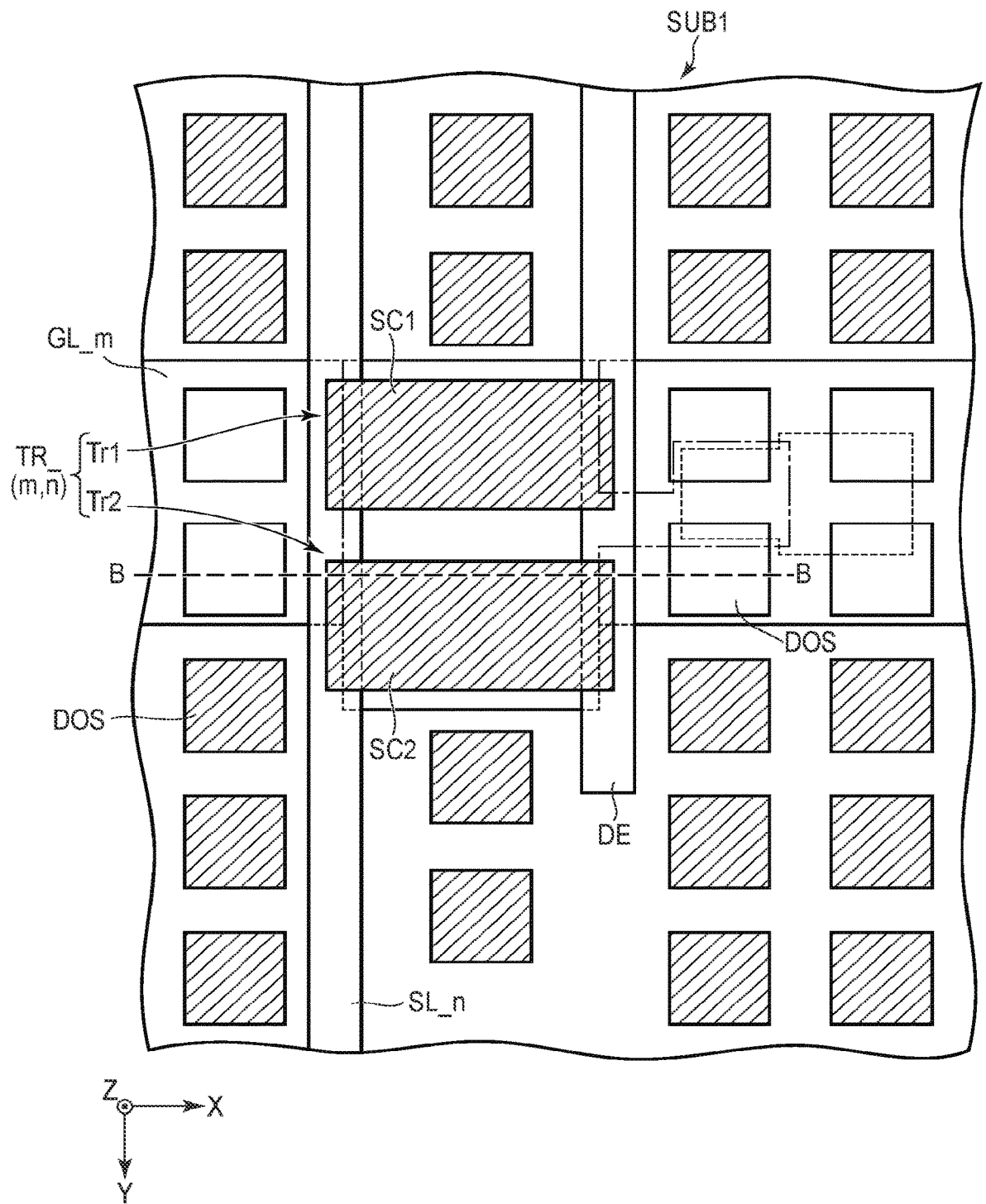
FIG. 7 is an enlarged plan view of the vicinity of a transistor TR_(m, n) of FIG. 6.
Figure 8:
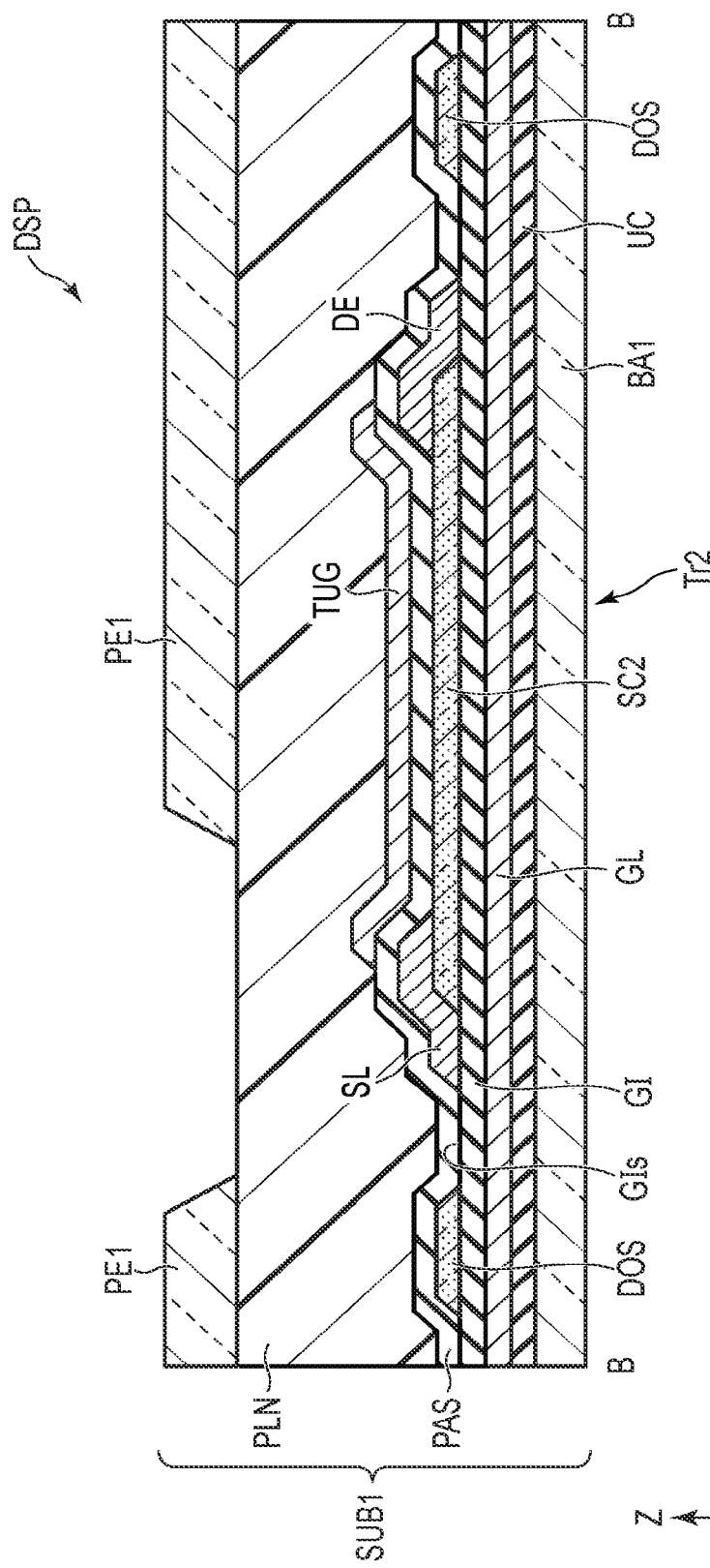
FIG. 8 is a cross-sectional view of the substrate SUB1 along line B-B of FIG. 7.

FIG. 7 is an enlarged plan view of the vicinity of the transistor TR_(m, n) of FIG. 6. FIG. 8 is a cross-sectional view of the substrate SUB1 along line B-B of FIG. 7.

As shown in FIGS. 6 to 8, the semiconductor layer DOS of the present configuration example overlaps the scanning line GL. The semiconductor layer DOS is formed in the same layer as the semiconductor layer SC (the semiconductor layers SC1 and SC2) of the transistor TR_(m, n).

The display device DSP of the present configuration example includes more semiconductor layers DOS than that of the above-described embodiment. In other words, the display device DSP of the present configuration example includes more oxygen supply sources. Accordingly, extraction of oxygen from the semiconductor layer SC can be further suppressed.

Consequently, degradation of the transistor characteristics of the transistor TR can be further suppressed.

In the present configuration example, effects equivalent to those produced in the above-described embodiment are produced.

Configuration Example 2

FIG. 9 is a plan view showing another configuration example in the present embodiment. The configuration example shown in FIG. 9 is different from the configuration example shown in FIG. 6 in that the dummy semiconductor layer is disposed overlapping the capacitance electrode OE.

In FIG. 9, in order to make the drawing easy to see, the line thickness and the hatching of semiconductor layers DOS overlapping the end portions of the other constituent elements of the display device DSP are changed. However, these semiconductor layers DOS are equivalent to the other semiconductor layers DOS.

In FIG. 9, in order to make the drawing easy to see, the pixel electrode PE1 is omitted. The pixel electrode PE1 is disposed at an equivalent position to the above-described pixel electrode PE1.

FIG. 9 is an enlarged plan view of the vicinity of the transistor TR_(m, n) of the present configuration example. As described above, the capacitance electrode OE is an electrode in the same layer as the signal line SL. The capacitance electrode OE in the same layer as the signal line SL may extract oxygen from the semiconductor layer SC of the transistor TR.

In addition, as shown in FIG. 9, the capacitive electrode OE occupies a large area in the pixel PX. Therefore, by disposing the semiconductor layer DOS overlapping the capacitance electrode OE, it is possible to further suppress extraction of oxygen from the semiconductor layer SC. Consequently, it is possible to further suppress degradation of the transistor characteristics of the transistor TR.

In the display device DSP in FIG. 9, the semiconductor layer DOS is disposed also in a region adjacent to the capacitance electrode OE in planar view. This region includes a region overlapping the pixel electrode PE2. In other words, the semiconductor layers DOS are disposed overlapping the capacitance electrode OE and the pixel electrode PE2.

Furthermore, it can be said that the semiconductor layer DOS of FIG. 9 is disposed in a region other than a region in which the signal line SL and the semiconductor layer SC (semiconductor layers SC1 and SC2) of the transistor TR are disposed. In other words, the semiconductor layer DOS does not overlap the signal line SL and the semiconductor layer SC of the transistor TR inside the pixel PX.

The display device DSP of the present configuration example includes even more semiconductor layers DOS than that of the configuration example 1. In other words, the display device DSP of the present configuration example includes even more oxygen supply sources. Accordingly, extraction of oxygen from the semiconductor layer SC can be further suppressed. Consequently, degradation of the transistor characteristics of the transistor TR can be further suppressed.

In the present configuration example, effects equivalent to those produced in the above-described embodiment are produced.

Configuration Example 3

FIG. 10 is a plan view showing another configuration example of the present embodiment. The configuration example shown in FIG. 10 is different from the configuration example shown in FIG. 5 in that dummy semiconductor layers overlapping constituent elements in the same layer as the signal line SL, that is, the signal line SL, the connection electrode DE and the capacitance electrode OE are formed of a uniformly-spreading film (so-called solid film) and dummy semiconductor layers adjacent to the transistor are formed in an island shape.

In FIG. 10, in order to make the drawing easy to see, the pixel electrode PE1 is omitted. The pixel electrode PE1 is disposed at an equivalent position to the above-described pixel electrode PE1.

FIG. 10 is an enlarged plan view of the vicinity of the transistor TR_(m, n) of the present configuration example. In FIG. 10, semiconductor layers DOSa overlapping the signal line SL, the connection electrode DE and the capacitance electrode OE are formed of a solid film. On the other hand, semiconductor layers DOSb adjacent to the transistor TR_(m, n) are formed in an island shape. As shown in FIG. 10, the size of the semiconductor layer DOSa formed of a solid film is greater than the size of the semiconductor layer DOSb formed in an island shape.

Here, the semiconductor layer DOSa overlapping the capacitance electrode OE is referred to as a semiconductor layer DOSac. The semiconductor layer DOSac is a solid film as described above, and is such a layer that one semiconductor layer uniformly spreads.

The entire capacitance electrode OE overlaps the semiconductor layer DOSac. In addition, the end portions of the semiconductor layer DOSac are located more outward than the end portions of the capacitance electrode OE in the first direction X and the second direction Y.

The semiconductor layer DOSa overlapping the connection electrode DE is referred to as a semiconductor layer DOSad. The semiconductor layer DOSad is a solid film as described above, and is such a layer that one semiconductor layer uniformly spreads.

The end portions in the first direction X of the semiconductor layer DOSad are located more outward than the end portions in the first direction X of the connection electrode DE.

In FIG. 10, the semiconductor layer DOSad close to the semiconductor layer DOSac is integrally formed with the semiconductor layer DOSac. However, the semiconductor layer DOSac and the semiconductor layer DOSad do not have to be integrally formed and may be separately formed depending on the distance between the capacitance electrode OE and the connection electrode DE.

The semiconductor layer DOSa overlapping the signal line SL is referred to as a semiconductor layer DOSas. The semiconductor layer DOSas overlaps the signal line SL along the signal line SL. The width in the first direction X of the semiconductor layer DOSas is greater than that of the signal line SL. In other words, the end portions of the semiconductor layer DOSas are located more outward than the end portions of the signal line SL in the first direction X.

The semiconductor layers DOSb do not overlap the semiconductor layer SC of the transistor TR_(m, n). The semiconductor layers DOSb are disposed between the signal line SL and the connection electrode DE and between the signal line SL and the pixel electrode PE2. In addition, the semiconductor layers DOSb are disposed on an opposite side to a side on which the signal line SL is adjacent to the connection electrode DE. Furthermore, the semiconductor layers DOSb are disposed on an opposite side to a side on which the connection electrode DE is adjacent to the signal line SL.

FIG. 11 is a cross-sectional view of the display device DSP along line C-C of FIG. 10. As shown in FIG. 11, when a surface of the signal line SL and a surface of the semiconductor layer DOSas which contact each other are referred to as a surface SLL and a surface DOSU, the entire surface SLL overlaps the surface DOSU. On the other hand, the surface DOSU includes a region which does not overlap the surface SLL.

In addition, in FIG. 11, when a side surface and an upper surface of the signal line SL are referred to as a surface SLS and a surface SLU, the surface SLS and the surface SLU are covered with the insulating layer PAS.

When the insulating layer PSA is formed of, for example, layers stacked such that the lower layer is a silicon oxide layer and the upper layer is a silicon nitride layer as described above, oxygen from the semiconductor layer DOSas can move to the signal line SL via the lower layer of the insulating layer PAS. Oxygen moving from the semiconductor layer DOSas is prevented from moving upward by the upper layer of the insulating layer PAS. Accordingly, oxygen from the semiconductor layer DOSas is more efficiently absorbed by the signal line SL. In addition, moisture or the like from the insulating layer PAS is blocked by the upper layer of the insulating layer PAS.

In the present configuration example, the semiconductor layers DOSa formed of a solid film are disposed overlapping the signal line SL and the capacitance electrode OE in the same layer as the signal line SL. That is, a surface of the signal line SL and a surface of the capacitance electrode OE which contact the semiconductor layers DOS entirely overlap the semiconductor layers DOS, respectively. Since the semiconductor layer DOS having a large area is an oxygen supply source, extraction of oxygen from the semiconductor layer SC of the transistor TR can be further suppressed. Therefore, according to the present configuration example, degradation of the transistor characteristics of the transistor TR can be further suppressed.

In the present configuration example, effects equivalent to those produced in the above-described embodiment are produced.

Configuration Example 4

Figure 12A:
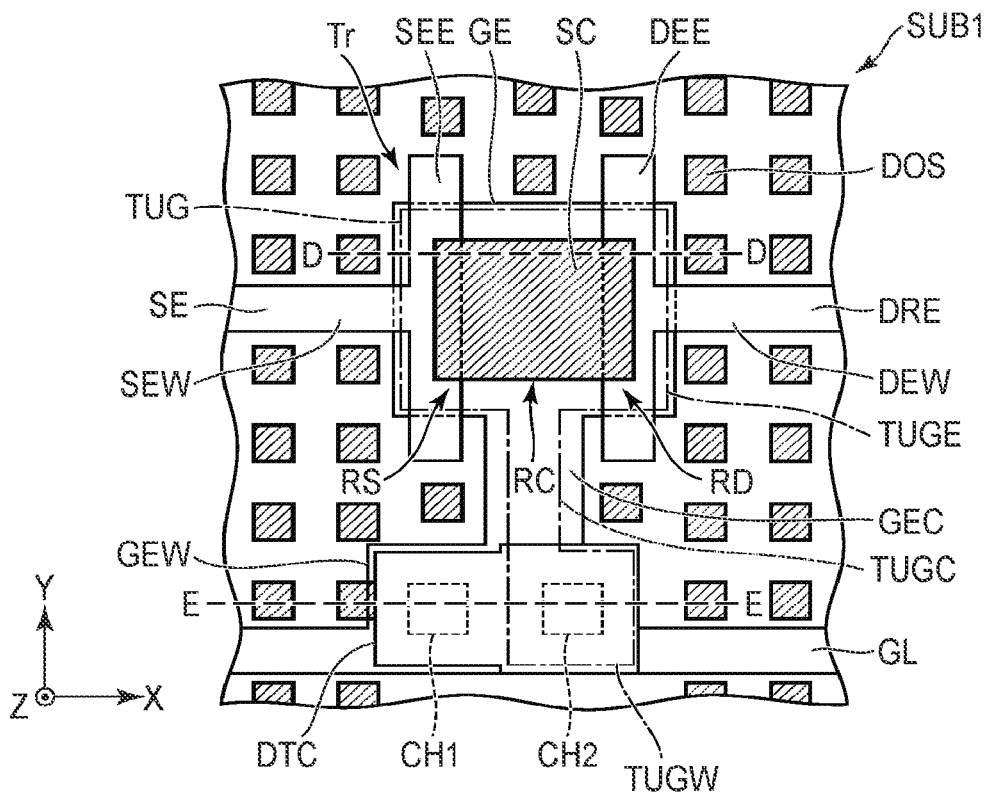
FIG. 12A is a plan view showing another configuration example in the present embodiment.
Figure 12B:
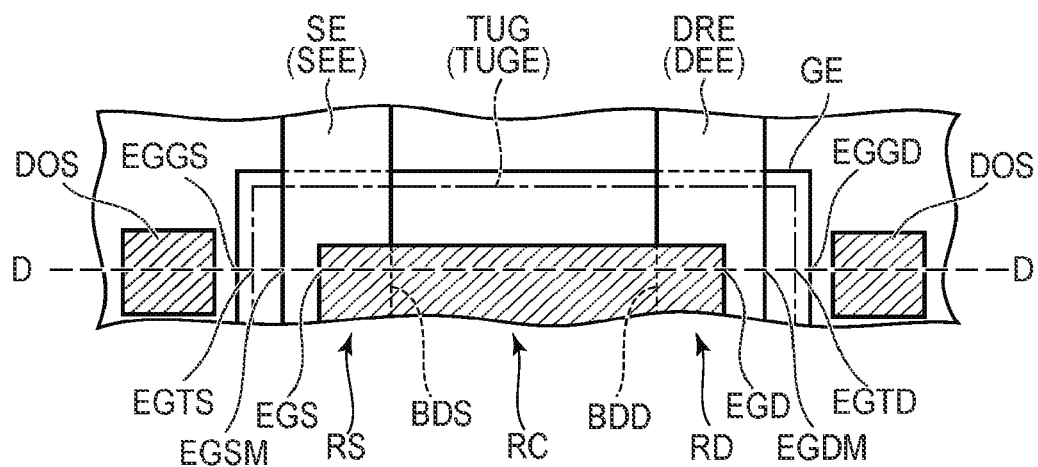
FIG. 12B is an enlarged plan view showing a part of a transistor shown in FIG. 12A.

FIG. 12A is a plan view showing another configuration example of the present embodiment. The configuration example shown in FIG. 12A is different from the configuration example shown in FIG. 1 in that the transistor is formed in a different shape. FIG. 12B is an enlarged view of the vicinity of the transistor of FIG. 12A.

FIG. 12A is a plan view of the substrate SUB1 of the present configuration example. In addition, FIG. 13A is a plan view showing the positional relationship between the semiconductor layer SC and the semiconductor layer DOS, and a wiring layer in the same layer as a gate electrode GE. FIG. 13B is a plan view showing the positional relationship between the semiconductor layer SC and the semiconductor layer DOS, and wiring layers in the same layer as a source electrode SE and a drain electrode DRE. FIG. 13C is a plan view showing the positional relationship between the semiconductor layer SC and the semiconductor layer DOS, and a wiring layer in the same layer as the auxiliary gate electrode TUG.

The substrate SUB1 shown in FIGS. 12A and 12B includes the transistor Tr and the semiconductor layer DOS. The transistor Tr includes the semiconductor layer SC, a gate electrode GE, a source electrode SE and a drain electrode DRE.

In addition, the substrate SUB1 shown in FIG. 12A includes the auxiliary gate electrode TUG and the connection electrode DTC.

As shown in FIGS. 12A and 13A, the substrate SUB1 includes the scanning line GL extending along the first direction X. The gate electrode GE has an island shape and overlaps the entire semiconductor layer SC. The scanning line GL and the gate electrode GE are connected via an electrode GEC extending in the second direction Y and an electrode GEW having an island shape. The gate electrode GE, the electrode GEC, the electrode GEW and the scanning line GL are integrally formed.

As shown in FIGS. 12A and 13B, the source electrode SE includes an electrode SEW extending in the first direction X and an electrode SEE extending in the second direction Y. A part of the electrode SEE overlaps a part of the semiconductor layer SC. A region in which the semiconductor layer SC of the transistor Tr overlaps the source electrode SE (electrode SEE) is referred to as a region RS.

The source electrode SE is electrically connected to the signal line SL. The source electrode SE and the signal line SL are integrally formed.

As shown in FIGS. 12A and 13B, the drain electrode DRE includes an electrode DEW extending in the first direction X and an electrode DEE extending in the second direction Y. A part of the electrode DEE overlaps a part of the semiconductor layer SC.

A region in which the semiconductor layer SC of the transistor Tr overlaps the drain electrode DRE (electrode DEE) is referred to as a region RD. The semiconductor layer SC includes the channel forming region RC between the region RS and the region RD.

As shown in FIGS. 12A and 13B, the connection electrode DTC includes an island-shaped electrode DTCG and an island-shaped electrode DTCT. The electrode DTCG and the electrode DTCT are integrally formed. The entire connection electrode DTC overlaps the scanning line GL and the electrode GEW.

The electrode DTCG is connected to the scanning line GL and the electrode GEW via the contact hole CH1. The electrode DTCT is connected to an electrode TUGW of the auxiliary gate electrode TUG which will be described later via the contact hole CH2.

The substrate SUB1 shown in FIGS. 12A and 13C includes the auxiliary gate electrode TUG. The auxiliary gate electrode TUG includes an electrode TUGE having an island shape, an electrode TUGC extending in the second direction Y, and an electrode TUGW having an island shape. The electrode TUGE, the electrode TUGC and the electrode TUGW are integrally formed.

The electrode TUGC covers the gate electrode GE and the semiconductor layer SC. The electrode TUGC is located inside the electrode GEC. The entire electrode TUGW overlaps the electrode GEW and the scanning line GL. In addition, the entire electrode TUGW overlaps the electrode DTCT of the connection electrode DTC.

Figure 14:
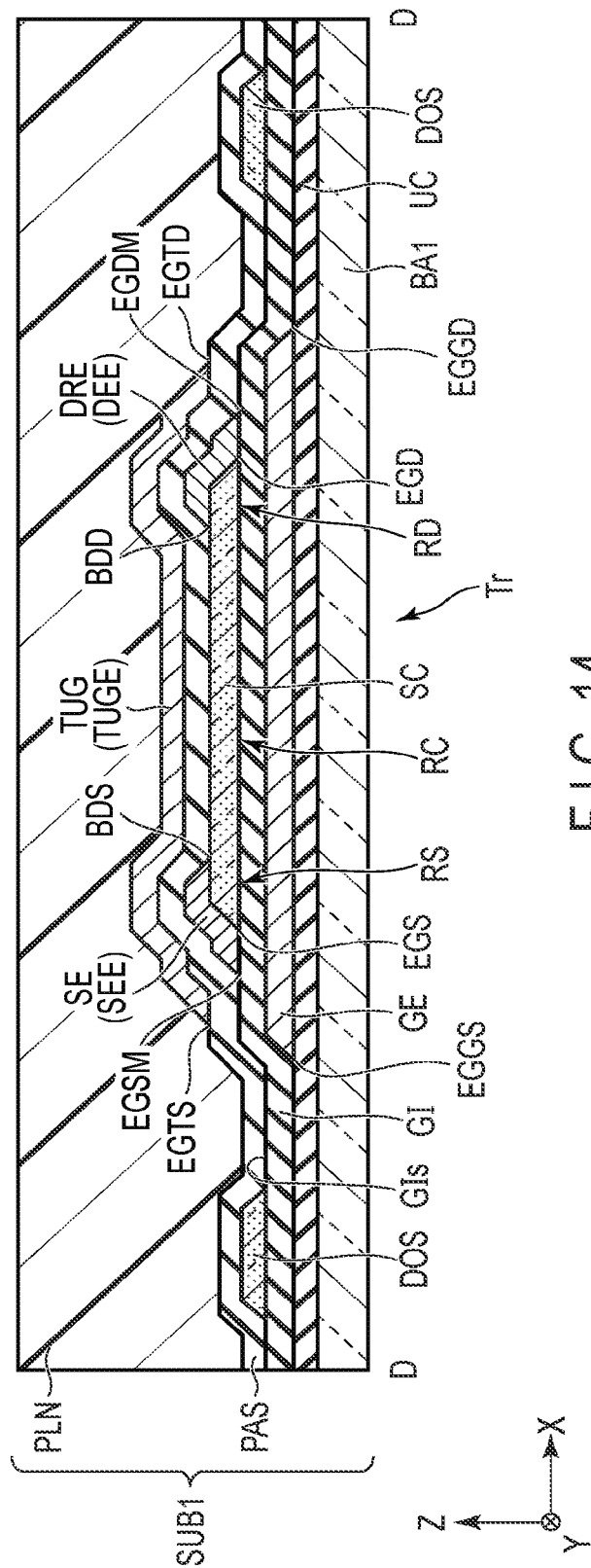
FIG. 14 is a cross-sectional view of the substrate SUB1 along line D-D of FIG. 12B.

FIG. 14 is a cross-sectional view of the substrate SUB1 along line D-D of FIGS. 12A and 12B.

In the transistor Tr, the base BA1, the insulating layer UC, the gate electrode GE, the insulating layer GI, the semiconductor layer SC, the source electrode SE (electrode SEE) and the connection electrode DE (electrode DEE), the insulating layer PAS, the auxiliary gate electrode TUG (electrode TUGE) and the insulating layer PLN are stacked in this order in the third direction Z.

As shown in FIGS. 12A and 12B, 13 and 14, the entire channel forming region RC of the semiconductor layer SC overlaps the gate electrode GE and the electrode TUGE of the auxiliary gate electrode TUG.

In addition, as shown in FIG. 14, in the region RS of the semiconductor layer SC, the boundary between the region RS and the channel forming region Rx is referred to as a boundary BDS, and an end portion opposed in the first direction X to the boundary BDS is referred to as an end portion EGS. In the region RD of the semiconductor layer SC, the boundary between the region RD and the channel forming region RC is referred to as a boundary BDD, and an end portion opposed in the first direction X to the boundary BDD is referred to as an end portion EGD.

An end portion on a source electrode SE side of the gate electrode GE is referred to as an end portion EGGS, and an end portion on a drain electrode DRE side of the gate electrode GE is referred to as an end portion EGGD.

In the source electrode SE, an end portion opposed in the first direction X to the boundary BDS is referred to as an end portion EGSM. In the drain electrode DRE, an end portion opposed in the first direction X to the boundary BDD is referred to as an end portion EGDM.

In the electrode TUGE of the auxiliary gate electrode TUG, an end portion on a source electrode SE side in the first direction X is referred to as an end portion EGTS. In the electrode TUGE of the auxiliary gate electrode TUG, an end portion on a drain electrode DRE side in the first direction X is referred to as an end portion EGTD.

As shown in FIGS. 12A and 12B, 13 and 14, the end portion EGTS of the electrode TUGE is located between the end portion EGGS of the gate electrode GE and the end portion EGSM of the signal line SL. The end portion EGTD of the electrode TUGE is located between the end portion EGGD of the gate electrode GE and the end portion EGDM of the signal line SL.

Figure 15:
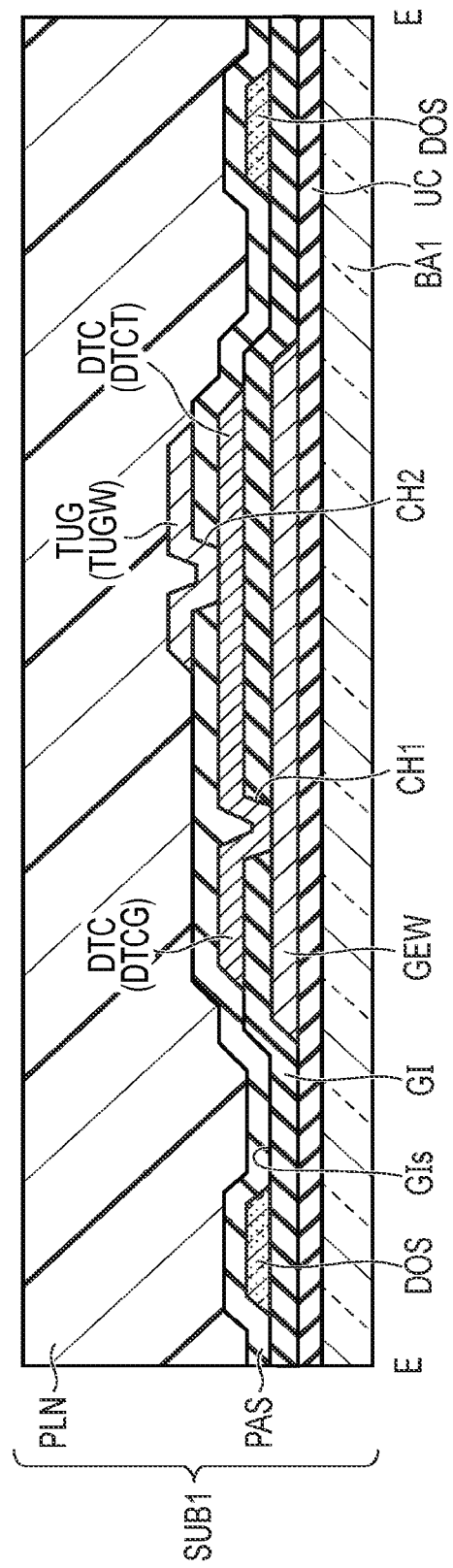
FIG. 15 is a cross-sectional view of the substrate SUB1 along line E-E of FIG. 12A.

FIG. 15 is a cross-sectional view of the substrate SUB1 along line E-E of FIG. 12A.

In the substrate SUB1 shown in FIG. 15, the base BA1, the insulating layer UC, the electrode GEW, the insulating layer GI, the connection electrode DTC (electrode DTCG and electrode DTCT), the insulating layer PAS, the auxiliary gate electrode TUG (electrode TUGW) and the insulating layer PLN are stacked in this order in the third direction Z.

As shown in FIGS. 12A and 15, the electrode DTCG is connected to the electrode GEW via the contact hole CH1 disposed in the insulating layer GI. The electrode DTCT is connected to the electrode TUGW of the auxiliary gate electrode TUG via the contact hole CH2 disposed in the insulating layer PAS.

Also in the present configuration example, the dummy semiconductor layers DOS are disposed close to the signal line SL and the wiring layer in the same layer as the signal line SL in planar view. In addition, both the semiconductor layer DOS and the signal line SL are in contact with the insulating layer PAS in cross-sectional view. Accordingly, oxygen of the semiconductor layer DOS is absorbed by the signal line SL via the insulating layer PAS. Therefore, extraction of oxygen from the semiconductor layer SC of the transistor Tr can be suppressed. Consequently, degradation of the transistor characteristics of the transistor Tr can be suppressed.

In the present configuration example, effects equivalent to those produced in the above-described embodiment are produced.

While certain embodiments have been described, these embodiments have been presented by way of example only, and are not intended to limit the scopes of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor substrate comprising:
    a base;
    a first insulating layer over the base;
    a second insulating layer over the first insulating layer;
    a scanning line disposed between the base and the first insulating layer;
    a signal line disposed between the first insulating layer and the second insulating layer;
    a transistor overlapping the scanning line and the signal line and comprising a first oxide semiconductor layer connected to the signal line; and
    a plurality of second oxide semiconductor layers disposed around the transistor, wherein
    an entire upper surface, which is a surface facing the second insulating layer, of each of the second oxide semiconductor layers is in contact with the second insulating layer,
    an entire bottom surface, which is a surface facing the first insulating layer, of each of the second oxide semiconductor layers is in contact with the first insulating layer, and
    no conductive wiring is electrically connected to the second oxide semiconductor layers.

2. The semiconductor substrate according to claim 1, wherein
    each of the second oxide semiconductor layers is not connected to the transistor.

3. The semiconductor substrate according to claim 1, wherein the second oxide semiconductor layers overlap the scanning line.

4. The semiconductor substrate according to claim 1, further comprising a capacitance electrode between the first insulating layer and the second insulating layer, wherein
    the second oxide semiconductor layers do not overlap the capacitance electrode.

5. The semiconductor substrate according to claim 1, wherein the second oxide semiconductor layers are arranged along the signal line.

6. The semiconductor substrate according to claim 1, wherein
    each of the second oxide semiconductor layers is formed in an island shape, and
    a size of each of the second oxide semiconductor layers is smaller than a size of the first oxide semiconductor layer.

7. The semiconductor substrate according to claim 1, wherein the second oxide semiconductor layers do not overlap either of the scanning line and the signal line.

8. A display device comprising:
    a semiconductor substrate comprising
        a first base,
        a first insulating layer over the first base,
        a second insulating layer over the first insulating layer,
        a scanning line disposed between the first base and the first insulating layer,
        a signal line disposed between the first insulating layer and the second insulating layer,
        a transistor overlapping the scanning line and the signal line and comprising a first oxide semiconductor layer connected to the signal line,
        a pixel electrode electrically connected to the transistor, and
        a second oxide semiconductor layer disposed close to the transistor;
    a counter-substrate comprising
        a second base opposed to the pixel electrode, and
        a counter-electrode located between the second base and the pixel electrode and opposed to the pixel electrode; and
    a display function layer located between the pixel electrode and the counter-electrode and subjected to a voltage applied between the pixel electrode and the counter-electrode, wherein
    an entire upper surface, which is a surface facing the second insulating layer, of the second oxide semiconductor layer is in contact with the second insulating layer,
    an entire bottom surface, which is a surface facing the first insulating layer, of the second oxide semiconductor layer is in contact with the first insulating layer, and
    no conductive wiring is electrically connected to the second oxide semiconductor layers.

9. The display device according to claim 8, wherein
    the second oxide semiconductor layer is not connected to the transistor.

10. The display device according to claim 8, wherein the second oxide semiconductor layer overlaps the scanning line.

11. The display device according to claim 8, wherein
    the display device comprises a plurality of the second oxide semiconductor layers, and
    the second oxide semiconductor layers do not overlap either of the scanning line and the signal line.

12. The display device according to claim 8, wherein the display function layer is an electrophoretic layer.

13. The display device according to claim 8, wherein the display function layer is a liquid crystal layer.

14. The display device according to claim 8, further comprising a capacitance electrode between the first insulating layer and the second insulating layer, wherein
    the display device comprises a plurality of the second oxide semiconductor layers, and the second oxide semiconductor layers do not overlap the capacitance electrode.

15. The display device according to claim 14, wherein the second oxide semiconductor layers are arranged along the signal line.

16. The display device according to claim 15, wherein
the display device comprises a plurality of the second oxide semiconductor layers adjacent to the first oxide semiconductor layer, and
each of the second oxide semiconductor layers is formed in an island shape.

* * * * *